（12）United States Patent
Whitney et al.

(10) Patent No.: US 8,289,123 B2
(45) Date of Patent: Oct. 16, 2012

(54) ELECTRICAL DEVICE WITH INTEGRALLY FUSED CONDUCTOR

(75) Inventors: Stephen J. Whitney, Lake Zurich, IL (US); Gordon Todd Dietsch, Park Ridge, IL (US); Christian Garcia, Caloocan (PH); Daniel Onken, Chatham, IL (US); Janus Pagharion, Paranaque (PH); Phil Shaw, Schaumburg, IL (US); Robert G. Swensen, Mount Prospect, IL (US)

(73) Assignee: Littelfuse, Inc., Chicago, IL (US)

( * ) Notice: Subject to any disclaimer, the term of this patent is extended or adjusted under 35 U.S.C. 154(b) by 1256 days.

(21) Appl. No.: 11/459,581

(22) Filed: Jul. 24, 2006

(65) Prior Publication Data
US 2007/0019351 A1  Jan. 25, 2007

Related U.S. Application Data

(60) Provisional application No. 60/701,687, filed on Jul. 22, 2005, provisional application No. 60/745,980, filed on Apr. 28, 2006.

(51) Int. Cl.
*H01H 85/10* (2006.01)
*H01H 69/02* (2006.01)
*H01H 85/20* (2006.01)
*H01H 85/04* (2006.01)

(52) U.S. Cl. ........ 337/295; 337/186; 337/159; 337/229; 29/623

(58) Field of Classification Search .......... 337/186, 337/159, 229, 295
See application file for complete search history.

(56) References Cited

U.S. PATENT DOCUMENTS

| 4,041,435 | A | * | 8/1977 | Gaia | 337/159 |
|---|---|---|---|---|---|
| 4,296,398 | A | * | 10/1981 | McGalliard | 337/297 |
| 4,308,515 | A | * | 12/1981 | Rooney et al. | 337/162 |
| 4,376,927 | A | | 3/1983 | McGalliard | |
| 4,503,415 | A | * | 3/1985 | Rooney et al. | 337/160 |
| 4,547,830 | A | | 10/1985 | Yamauchi | |
| 4,626,818 | A | * | 12/1986 | Hilgers | 337/166 |
| 4,771,260 | A | * | 9/1988 | Gurevich | 337/231 |
| 4,862,134 | A | | 8/1989 | Poerschke et al. | |
| 4,873,506 | A | * | 10/1989 | Gurevich | 337/290 |
| 4,924,203 | A | * | 5/1990 | Gurevich | 337/231 |
| 4,926,153 | A | * | 5/1990 | Gurevich | 337/273 |
| 5,097,246 | A | * | 3/1992 | Cook et al. | 337/297 |
| 5,262,750 | A | * | 11/1993 | Gurevich | 337/273 |
| 5,345,210 | A | * | 9/1994 | Swensen et al. | 337/163 |
| 5,563,472 | A | * | 10/1996 | Cassidy | 315/119 |
| 5,631,620 | A | * | 5/1997 | Totsuka et al. | 337/260 |
| 5,905,426 | A | * | 5/1999 | Douglass | 337/229 |
| 5,963,123 | A | * | 10/1999 | Douglass | 337/254 |
| 5,982,268 | A | * | 11/1999 | Kawanishi | 337/297 |
| 6,040,754 | A | * | 3/2000 | Kawanishi | 337/297 |

(Continued)

OTHER PUBLICATIONS

Article from Schott North America, "All About Glass-to-Metal Seals; Introduction to GTMS ," printed from www.us.schott.com on Feb. 22, 2006.
Article from Tekna Seal, "Glass-to-Metal Hermetic Seal Basics," printed from www.teknaseal.com printed on Feb. 22, 2006.

(Continued)

*Primary Examiner* — Bradley Thomas
(74) *Attorney, Agent, or Firm* — Kacvinsky Daisak pllc

(57) ABSTRACT

A fused conductor includes a first conductor portion, a second conductor portion, and a fuse element in electrical communication with the first and second conductor portions via at least one dual metal wire, the fuse element protected by a glass body bonded chemically to the dual metal wire.

9 Claims, 29 Drawing Sheets

U.S. PATENT DOCUMENTS

| | | | | |
|---|---|---|---|---|
| 6,043,966 | A * | 3/2000 | Krueger et al. | 361/104 |
| 6,269,745 | B1 * | 8/2001 | Cieplik et al. | 102/202.5 |
| 6,300,859 | B1 * | 10/2001 | Myong et al. | 337/182 |
| 6,563,684 | B2 | 5/2003 | Kanamaru et al. | |
| 6,590,490 | B2 * | 7/2003 | Ackermann | 337/290 |
| 6,622,375 | B1 * | 9/2003 | Endo et al. | 29/623 |
| 7,659,804 | B2 * | 2/2010 | Harris et al. | 337/159 |
| 2003/0206093 | A1 * | 11/2003 | Hamada | 337/159 |
| 2004/0113745 | A1 * | 6/2004 | Lell et al. | 337/157 |
| 2006/0170528 | A1 * | 8/2006 | Fukushige et al. | 337/297 |
| 2006/0214259 | A1 * | 9/2006 | Spaunhorst | 257/529 |

OTHER PUBLICATIONS

Article from TWI World Centre for materials Joining Technology, "Ceramics Joining—Glass to Metal Seals," written by Alan Taylor, printed from www.twi.co.uk on Feb. 22, 2006.

"Subminiature Fuses No. 275/Picofuse Lead Free," 2 pages, marketing brochure published by Wickmann (undated).

"Subminiature Circuit Protector," 1 page, marketing brochure published by Cooper Bussmann (undated).

International Search Report for PCT/US2006/28639 mailed Sep. 20, 2007.

* cited by examiner

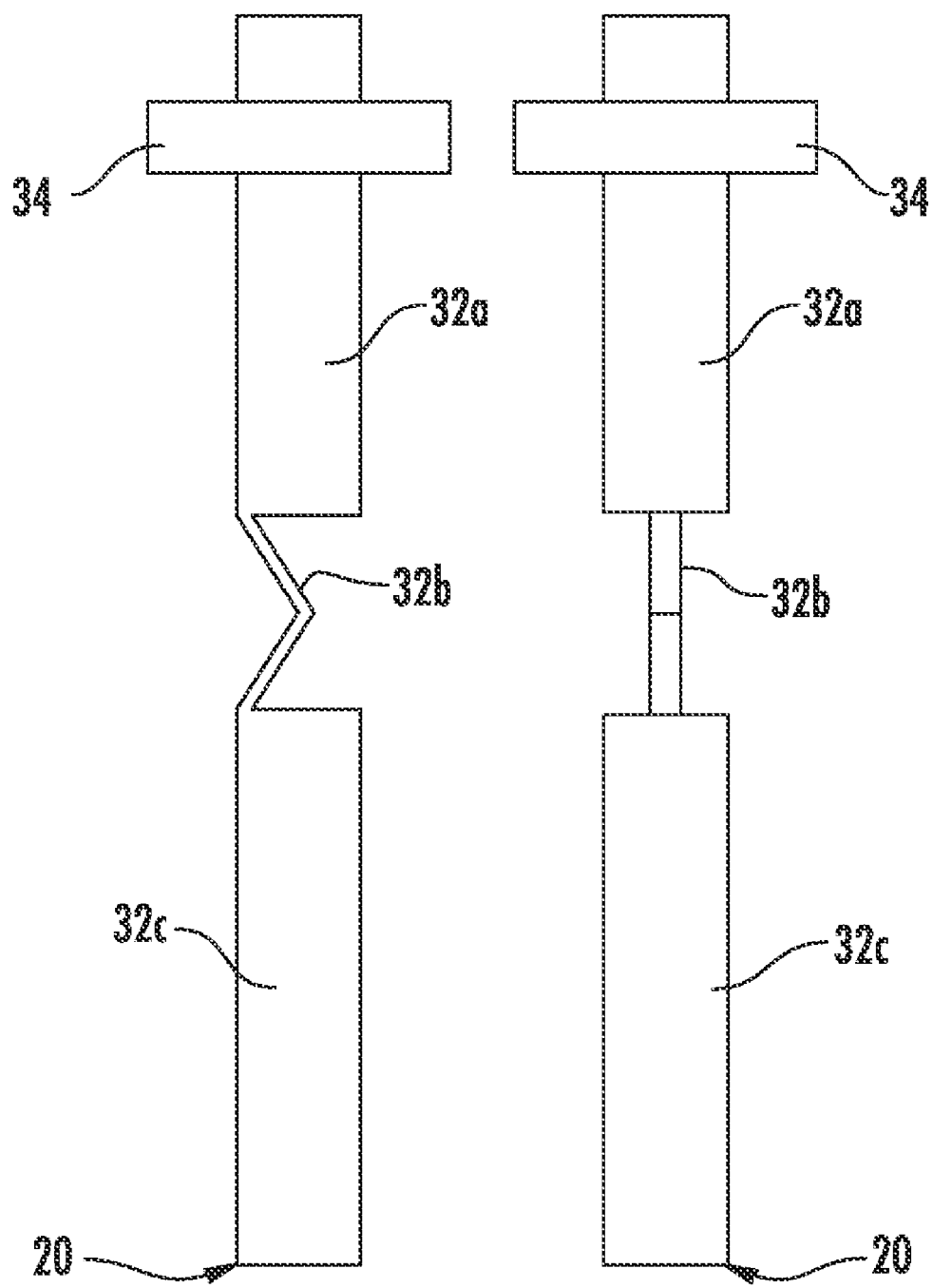

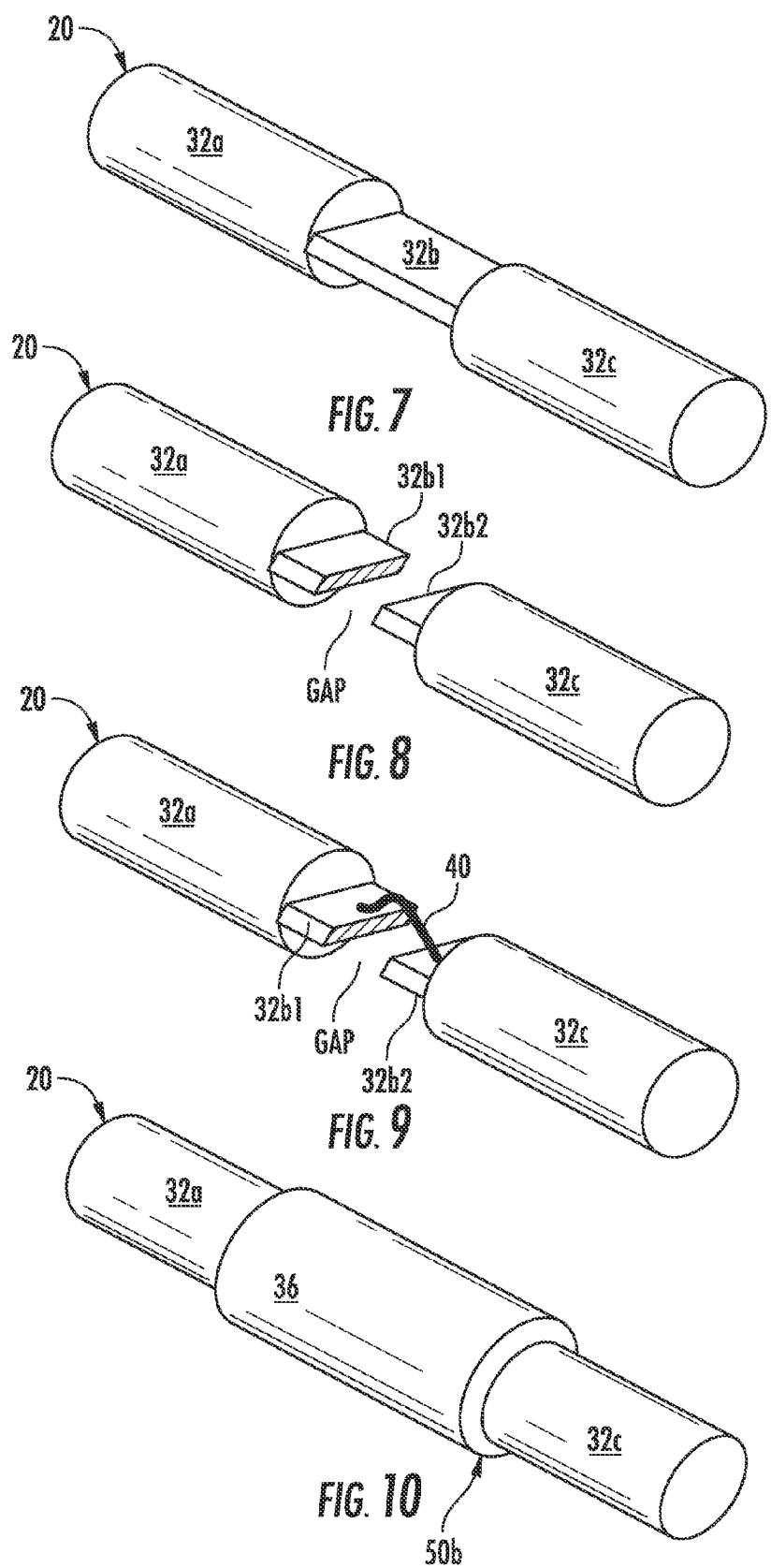

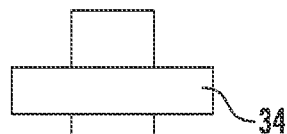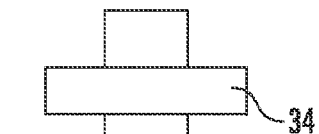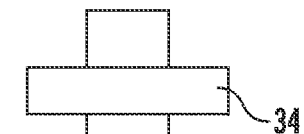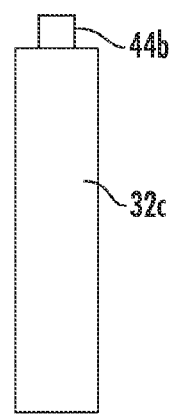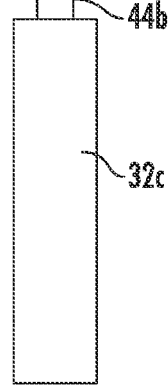
FIG. 17    FIG. 18    FIG. 19

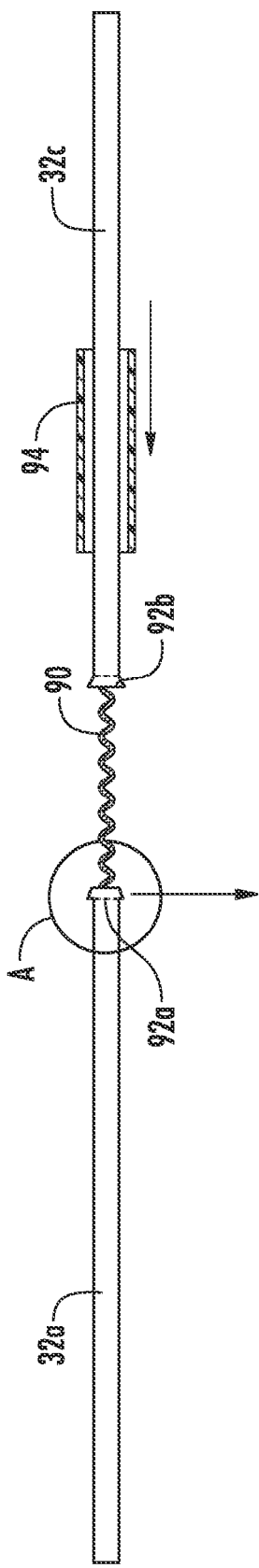
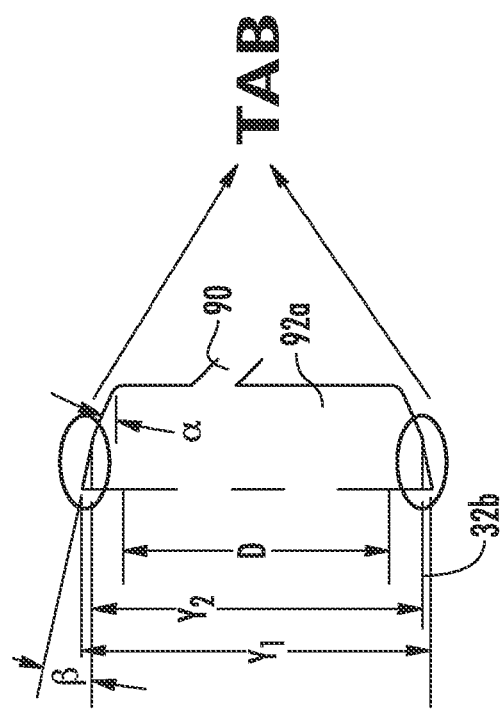
FIG. 34
FIG. 35

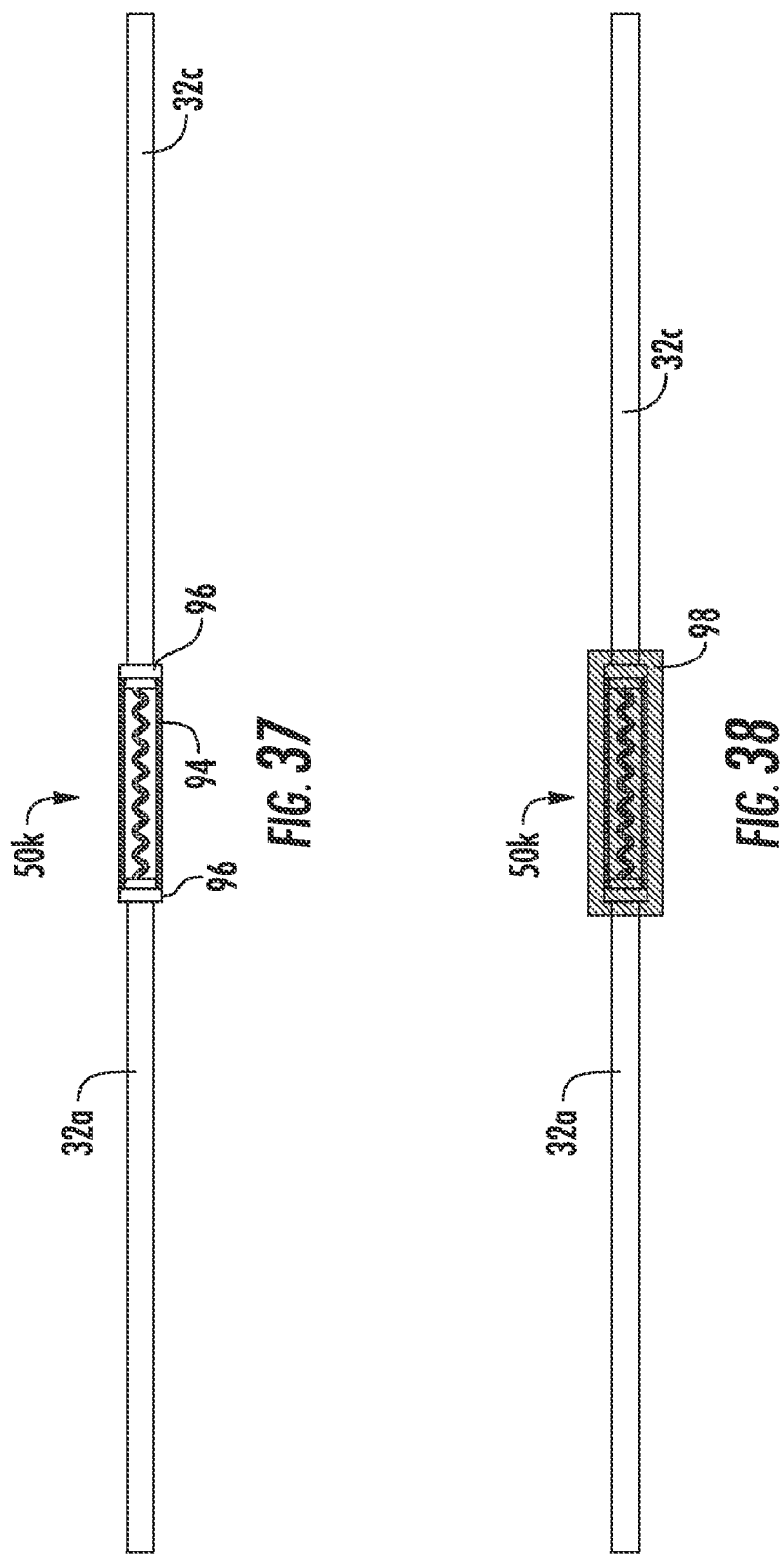

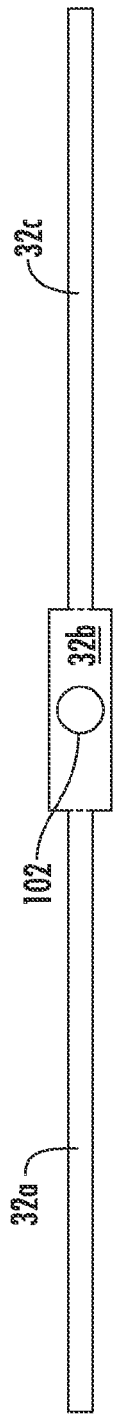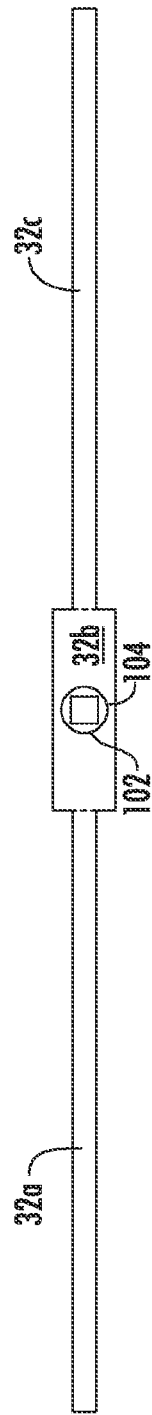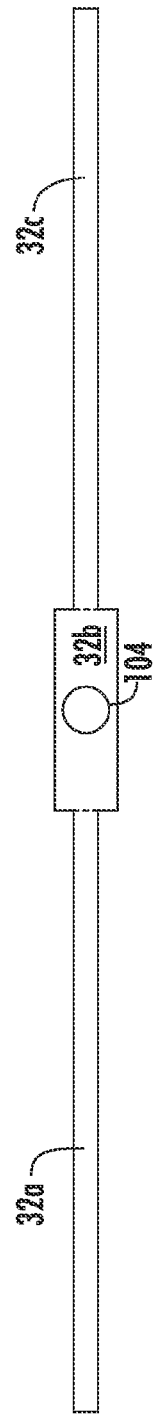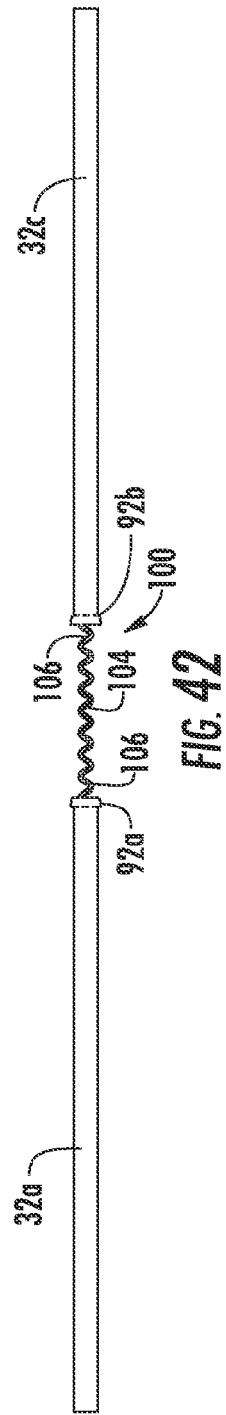

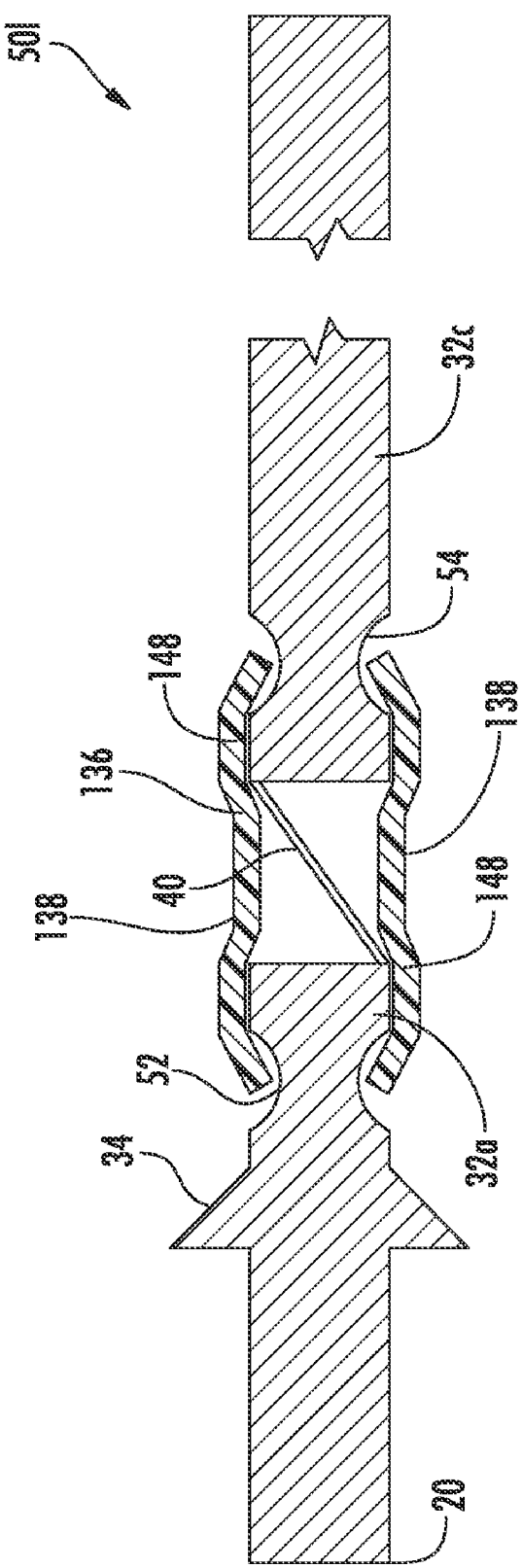

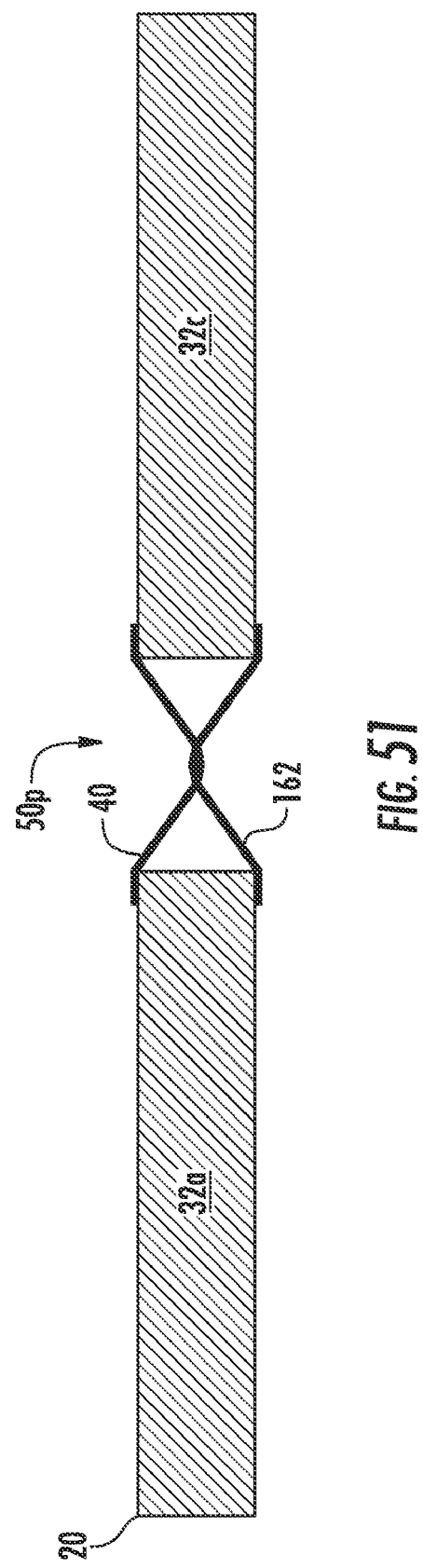

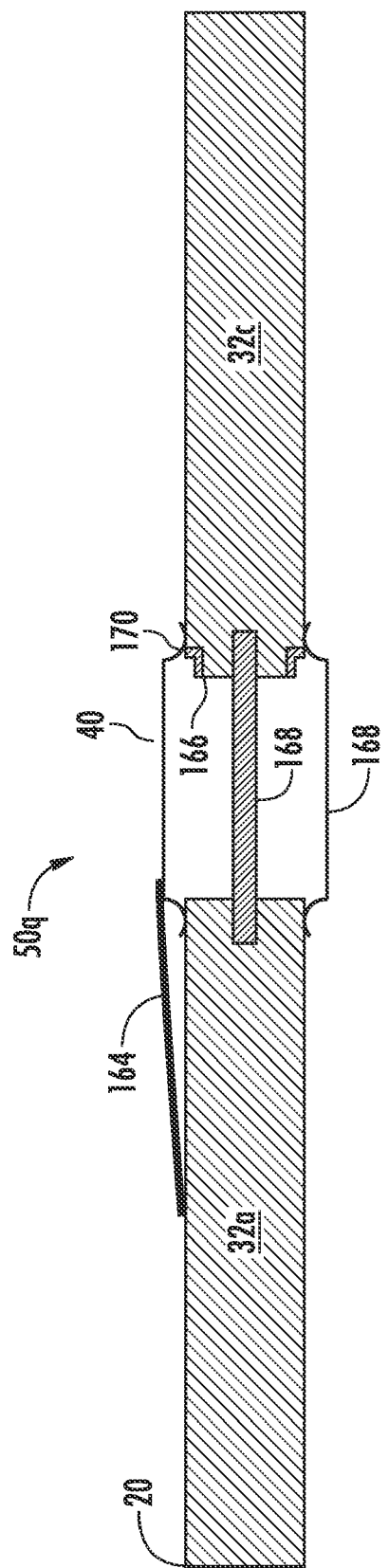

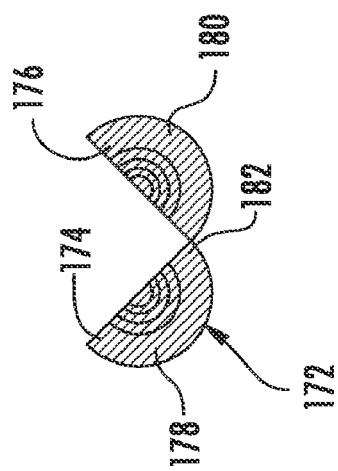
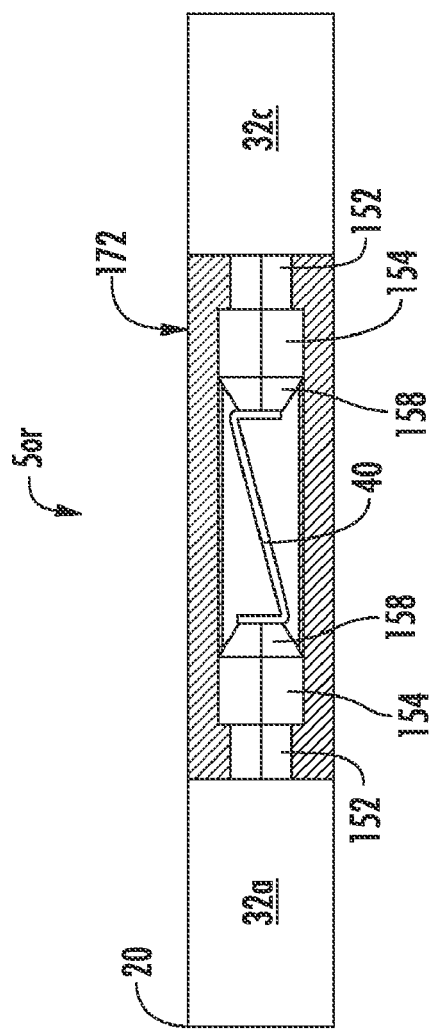
FIG. 54
FIG. 53

ELECTRICAL DEVICE WITH INTEGRALLY FUSED CONDUCTOR

PRIORITY CLAIM

This application claims priority to and the benefit of U.S. Provisional Patent Application No. 60/701,687, filed Jul. 22, 2005, entitled, Electrical Device With Integrally Fused Conductor and U.S. Provisional Patent Application No. 60/745,980, filed Apr. 28, 2006, entitled, Electrical Device With Integrally Fused Conductor, the entire contents of each of which are hereby incorporated by reference and relied upon.

BACKGROUND

The present disclosure relates generally to fuse protection.

It is known to integrate fuses into electrical devices. U.S. Pat. No. 5,563,472 ("the '472 patent") entitled Integrated Fuse Lighting System, the entire contents of which are incorporated herein by reference, discloses such a device. Prior art FIGS. 1A, 1B and 1C show one example from the '472 patent, which is a ribbon-type electroluminescent lighting assembly. Lighting systems may include modular lighting units having an elongated casing, e.g., in the form of an extruded tubular housing of resilient, translucent or transparent material (e.g. plastic tubing). Within the extruded tubular housing is a sequence of spaced-apart bulbs or other light emitting sources (such as LEDs, incandescent bulbs, or other electroluminescent lamps) in series and/or parallel relationship with one another. The respective lighting sources can be inter-connectable with one another, in a series and/or parallel relationship, to form multi-unit extended lighting systems.

Prior art FIG. 1A shows a portion of a ribbon-type electroluminescent lighting assembly 10. Assembly 10 includes a substrate 12. Substrate 12 includes metal foil conductors 14 and 16, which are coupled in electrically with an alternating current ("AC") voltage supply (not illustrated). The voltage supply delivers electrical power to an electroluminescent lighting unit (not illustrated) employing lighting assembly 10.

Substrate 12 of assembly 10 is laminated with a transparent film layer 18, which overlays conductors 14 and 16 and substrate 12 and enables light to be transmitted through the film layer when the assembly 10 and corresponding electroluminescent lighting unit is operatively actuated.

Prior art FIG. 1B is a top perspective view of the composite ribbon-type electroluminescent lighting assembly 10 shown in FIG. 1A, but which employs a fuse 20, as disclosed in the '472 patent. Prior art FIG. 1C is a corresponding bottom perspective view of the electroluminescent lighting assembly 10 of FIG. 1B. FIGS. 1B and 1C show the physical coupling of fuse 20 to conductor 16. Fuse 20 is disclosed in the '472 patent to be a Pico® fuse type. Fuse 20 as shown in a cutaway from substrate 12 includes fuse leads 22 and 24. Fuse leads 22 and 24 of fuse 20 are joined mechanically to conductor 16 via crimpable auto-splice members 26 and 28, respectively.

Auto-splice members 26 and 28 add cost, complexity and potential for defect to assembly 10. In certain applications, it may be impossible to attach members 26 and 28 reliably. In other applications, even if members 26 and 28 can be attached reliably, there may simply not be room for the members 26 and 28 in the overall assembly. A need therefore exists for a better way to provide integral fusing for the above-described lighting system as well as other electrical systems and devices, such as cell phones, cameras, telecom units, etc.

SUMMARY

The present invention includes an integrally fused electrical device. In one example, the electrical device is an electroluminescent lighting assembly of a lighting unit. Multiple lighting units may be connected together to form a multi-unit lighting array. An example of such a multi-unit lighting array is a parallel or serial arrangement of electroluminescent units (in which the units are provided in a laminated structure having a ribbon-like configuration), such as those shown and described in U.S. Pat. No. 5,051,654, the entire contents of which are incorporated herein by reference.

The individual lighting unit includes a housing, such as a cylindrical, rectangular or square housing. The housing defines an interior volume containing circuitry and a light source or load. The housing also defines feed-through openings to allow feed wires to pass through the housing to connect electrically to the circuitry and the light source. The light source element may be of any suitable type, such as: an electroluminescent material, a light emitting diode, a field emitter anode having a phosphorluminescent material, etc.

The light source of the lighting unit is connected electrically to conductors, which are in turn connected to the feed through wires to deliver power to the light source. In the present invention, one of the conductors is thinned or made smaller to form a fuse element or fuse portion of the conductor. In one embodiment, the fused conductor (including the fused portion) is made of a metal foil type described above. Here, a portion of the foil conductor is etched away or otherwise removed to form a thinner, fuse link portion. In this manner, the auto-splice members 26 and 28 discussed above are eliminated. The thinned fuse element portion of the metal foil conductor may be placed on a same substrate assembly, e.g., printed circuit board assembly, with other electronics of the lighting unit, the light source of the lighting unit or both. The fused foil conductor is alternatively placed on its own substrate or printed circuit board.

The fused portion of the conductor is sized to be rated above a useful amperage for the lighting unit. For example, if typical loads call for the lighting unit to draw X amps, the fuse portion can be rated for example for 3× to 5× amps. Upon an overcurrent condition, the fuse portion opens at the rated amperage, protecting the remainder of the unit and potentially other units connected in series or parallel with the shorted unit from higher and potentially harmful amperages. Various embodiments for the fused conductor discussed herein are believed to be readily and controllably manufactured to produce an electrical device, such as a lighting unit, having desirable fuse opening characteristics.

While the metal foil fused conductor and the lighting unit present one suitable application for the fused conductor, the fused conductor may have cross-sectional shapes different than the metal foil shape and be integrated with other applications having inline conductors or even non-inline conductors, such as bent conductors. Such other applications include, without limitation, cell phones, power supplies, telecom units, cameras, digital music players, personal electronic mail devices, etc.

To the above-described ends, in one primary embodiment an integrally fused electrical device is provided. The electrical device includes: a housing, a load located within the housing, a first conductor located within the housing and connected electrically to the load, a second conductor located without the housing and connected electrically to the load, and wherein at least one of the first and second conductors is a fused conductor which includes a thinned portion, the thinned portion configured to open upon an overcurrent event.

In one embodiment, the fused conductor includes a film placed on a substrate.

In various embodiments, the fused conductor is at least substantially circular or rectangular in cross-section.

In one embodiment, the thinned portion is produced via a process selected from the group consisting of: etching, grinding, coining, stamping, milling and any combination thereof.

In one embodiment, the thinned portion is protected by an enclosure or encapsulant.

In one embodiment, the enclosure or encapsulant is made of at least one material selected from the group consisting of: glass, ceramic and plastic.

In one embodiment, the enclosure is connected to separate sections of the fused conductor via at least one process selected from the group consisting of: press-fitting, epoxy adhesion, radiant heating, induction heating and laser heating.

In one embodiment, the thinned portion includes an initially separate fuse wire, which is placed in electrical communication with separate sections of the fused conductor.

In one embodiment, the fuse wire is connected to integrally thinned portions of the separate sections of the fused conductor.

In one embodiment, the separate sections each define grooves that aid attachment of an enclosure to the separate sections of the fused conductor.

In one embodiment, the fuse wire is carried with the enclosure and the enclosure fits over ends of the separate sections of the fused conductor.

In one embodiment, the thinned portion includes a metallization on a surface of an enclosure that joins separate sections of the fused conductor.

In one embodiment, the metallization is formed on at least substantially all of the inner surface of the enclosure.

In another primary embodiment, a fuse configured to connect to at least substantially inline electrodes is provided. The fuse includes: a tubular enclosure and a fuse element carried by the tubular enclosure. The element extends within the enclosure so that the element contacts the electrodes after the enclosure is fitted onto the electrodes.

In one embodiment, the fuse element is sized to provide a desired electrical opening characteristic.

In one embodiment, the fuse element is wire-shaped and its diameter is sized to provide the desired characteristic.

In one embodiment, the fuse element is plated onto the enclosure and its thickness is sized to provide the desired characteristic.

In one embodiment, the fuse element is (i) reduced in size or (ii) coated with a dissimilar metal at a position of the element desirable for opening.

In a third primary embodiment, a method for providing circuit protection is provided, which comprises: (i) providing a tubular enclosure; (ii) fitting a fuse element within the enclosure; and (iii) fixing electrodes of an electrical device to the enclosure such that the electrodes contact the fuse element.

In one embodiment, fixing the electrodes to the enclosure includes inserting the electrodes into apertures defined by the enclosure.

In one embodiment, fixing the electrodes to the enclosure includes at least one process selected from the group consisting of: press-fitting, epoxy adhesion, radiant heating, induction heating and laser heating.

In one embodiment, fixing the electrodes to the enclosure includes positioning the electrodes at least substantially inline with the enclosure.

In a fourth primary embodiment, a fused conductor is provided, which includes: (i) a first conductor portion; (ii) a second conductor portion; (iii) a fuse element in electrical communication with the first and second conductor portions via at least one dual metal wire; and (iv) a protective glass or ceramic body bonded chemically to the dual metal wire.

In one embodiment, the element is a thin film element.

In one embodiment, the element is provided on a substrate.

In one embodiment, the element is held in electrical communication with the at least one dumet wire via a compressive force provided from the glass or ceramic body.

In one embodiment, the fused conductor is connected in an electrical device to at least one of a power source and a power load.

In a fifth primary embodiment, a fused conductor is provided, which includes: (i) a first conductor portion; (ii) a second conductor portion; (iii) a fuse element in electrical communication with the first and second conductor portions; and (iv) a protective glass body bonded chemically to the first and second conductor portions, the glass and conductor portions made of materials suitable for chemical bonding.

In a sixth primary embodiment, a fused conductor is provided, which includes: (i) a first conductor portion having an end defining a slot; (ii) a second conductor portion having an end defining a slot; and (iii) a fuse element in electrical communication with first and second terminations, the first and second terminations inserted into the first and second slots, respectively, so that the first and second terminations are in electrical communication with the first and second conductor portions, respectively.

In one embodiment, the fused conductor includes a cap protecting the fuse element.

In one embodiment the cap is of at least one type selected from the group consisting of: an epoxy cap, a polymer cap, a glass cap, a ceramic cap, and a cap configured to be adhered to the first and second conductor portions.

In one embodiment the element is a thin film element.

In one embodiment the element is provided on a substrate.

In one embodiment, the fused conductor is connected in an electrical device to at least one of a power source and a power load.

In a seventh primary embodiment, a fused conductor is provided, which includes: (i) a first conductor portion having an end defining a notch; (ii) a second conductor portion having an end defining a notch; and (iii) a fuse element in electrical communication with first and second terminations, the first and second terminations coupled to an interior surface of each of the first and second notches, respectively, so that the first and second terminations are in electrical communication with the first and second conductor portions, respectively.

In one embodiment, the fused conductor includes a cap protecting the fuse element.

In one embodiment, the cap is of at least one type selected from the group consisting of: an epoxy cap, a polymer cap, a glass cap, a ceramic cap, and a cap configured to be adhered to the first and second conductor portions.

In one embodiment, the element is a thin film element.

In one embodiment, the element is provided on a substrate.

In one embodiment, the fused conductor is connected in an electrical device to at least one of a power source and a power load.

In an eighth primary embodiment, a fused conductor is provided, which includes: (i) a first conductor portion having an end defining a flat; (ii) a second conductor portion having an end defining a flat; and (iii) a fuse element in electrical communication with first and second terminations, the first and second terminations coupled to one of two flat surfaces of each of the first and second flats, respectively, so that the first and second terminations are in electrical communication with the first and second conductor portions, respectively.

In one embodiment, the fused conductor includes a cap protecting the fuse element.

In one embodiment, the cap is of at least one type selected from the group consisting of: an epoxy cap, a polymer cap, a glass cap, a ceramic cap, and a cap configured to be adhered to the first and second conductor portions.

In one embodiment, the element is a thin film element.

In one embodiment, the element is provided on a substrate.

In one embodiment, the fused conductor is connected in an electrical device to at least one of a power source and a power load.

In a ninth primary embodiment, a fused conductor is provided, which includes: (i) a first conductor portion; (ii) a second conductor portion; (iii) a protective glass or ceramic body bonded chemically to the first and second conductor portions; and (iv) a wire fuse element held in electrical communication with the first and second conductor portions via protective glass body.

In one embodiment, the wire fuse element is threaded diagonally within the glass or ceramic body.

In one embodiment, the first and second conductor portions each include narrowed ends, the protective glass or ceramic body bonded chemically to the narrowed ends.

In one embodiment, the narrowed ends are made of a dumet material.

In one embodiment, the narrowed ends are connected to the first and second conductor portions.

In one embodiment, the fused conductor is connected in an electrical device to at least one of a power source and a power load.

In a tenth primary embodiment, a fused conductor is provided, which includes: (i) a first conductor portion; (ii) a second conductor portion; (iii) a fuse element held in electrical communication with the first and second conductor portions; (iv) first and second tabs located at first and second ends of the fuse element; and (v) a housing, the first and second tabs and housing configured to form a press-fit relationship when the housing is inserted over the tabs.

In one embodiment, the tabs are angled and aligned such that the housing can be slid over the tabs from a single direction.

In one embodiment, the housing is of a material selected from the group consisting of: plastic, glass and ceramic.

In one embodiment, the fuse element includes at least one characteristic selected from the group consisting of: (i) having a flattened surface from a stamping process; and (ii) being serpentine shaped.

In one embodiment, the fuse element includes a fusing alloy portion.

In one embodiment, the fusing alloy portion includes at least one characteristic selected from the group consisting of: (i) having a flattened surface from a stamping process; and (ii) being serpentine shaped.

In an eleventh primary element, a fused conductor is provided, which includes: (i) a first conductor portion; (ii) a second conductor portion; (iii) the first and second conductor portions defining grooves; (iv) a fuse element held in electrical communication with the first and second conductor portions; and (v) a heat-shrink enclosure housing the element and collapsed via heat around ends of the first and second conductor portions and into the grooves for securely holding the enclosure to the first and second conductor portions.

In various embodiments, the fuse element is a wire fuse element and/or is soldered to the first and second conductor portions.

In one embodiment, the first and second conductor portions are held apart while the heat-shrink enclosure is heated to form its final shape around the first and second conductor portions, after which the heat-shrink enclosure holds the first and second conductors portions apart at a desired distance.

In a twelfth primary embodiment, a fused conductor is provided which includes: (i) a first conductor portion; (ii) a second conductor portion; (iii) the first and second conductor portions each defining ends having stepped down radiuses, with a larger radius section and a smaller radius section; (iv) a fuse element connected to the smaller radius section of the ends of the first and second conductor portions; (v) a heat-shrink sleeve placed over the smaller radius sections of the ends, the heat-shrink sleeve having an outside diameter at least substantially flush with the larger radius section of the ends; and (vi) a molded plastic enclosure covering the heat-shrink sleeve and a part of the ends of the first and second conductor portions, the molded plastic enclosure having an outer diameter at least substantially the same as a diameter of the first and second conductor portions.

In one embodiment, the fuse element is a wire element and/or is soldered to the smaller diameter sections of the ends of the first and second conductor portions.

In a thirteenth primary embodiment, the heat-shrink sleeve described in the twelfth primary element is replaced by a plastic sleeve, which creates an air cavity around the element. A thermoplastic enclosure is molded around the plastic sleeve. In an embodiment, the outer plastic enclosure has an outside diameter that is at least substantially the same as the outer diameter of the first and second conductor portions.

In one embodiment, the element is a wire element. The wire element can be soldered to the ends of the first and second conductor portions.

In a fourteenth primary embodiment, a fused conductor is provided which includes: (i) a first conductor portion; (ii) a second conductor portion; (iii) the first and second conductor portions each defining a press-fitting extension; (iv) a fuse body defining an aperture configured and sized to make an interference fit with the press-fitting extensions of the first and second conductors; and (v) a fuse element secured via the press-fitting relationship between the housing and the extensions of the first and second conductor portions.

In various embodiments, the fuse element is a wire fuse element and/or is soldered additionally to the first and second conductor portions.

In a fifteenth primary embodiment, a fuse conductor is provided which includes: (i) a first conductor portion; (ii) a second conductor portion; (iii) a fuse element held in electrical communication with the first and second conductor portions; and (iv) a shape memory alloy member connected to the first and second conductor portions and contacting the fuse element, the shape memory alloy member configured to return to a predefined shape upon an over temperature condition and in that process open the fuse element from one of the first and second conductor portions.

In an embodiment, the shape memory alloy member is coated with an insulating material.

In an embodiment, at least one of the fuse element and the shape memory alloy member is solder to the first and second conductor portions.

In an sixteenth primary embodiment, a fused conductor is provided which includes: (i) a first conductor portion; (ii) a second conductor portion; (iii) at least one nonconductive post holding the first and second conductor portions in a fixed space relationship with respect to one another; (v) a conductive spring is fixed at one end the first conductor portion and rests slidably at its other end against the second conductor portion; (vi) an insulating sleeve is located at an end of the second conductor portion; and (vii) a shape memory alloy member connected to the first conductor portion and to the conductive spring, such that upon an over-temperature condition, the shape memory alloy member returns to a preset position an pulls the conductive spring so that it contacts the insulating sleeve, thereby opening the fused conductor.

In one embodiment, at least one nonconductive post is adhered to the first and second conductors.

In one embodiment, the nonconductive post includes metal ends that are soldered to the first and second conductors.

In one embodiment, the conductive spring is soldered to the first conductor portion.

In one embodiment, the shape memory alloy is soldered to at least one of the first conductive portion and the conductive spring.

In a seventeenth primary embodiment, a fused conductor is provided, which includes: (i) a first conductive portion; (ii) a second conductive portion; (iii) a fuse element fixed to the first and second conductive portions, and (iv) a molded enclosure having a clamshell configuration, such that it hinges open and closed, the molded clamshell enclosure snapped together or otherwise fixed around the fuse element and at least a portion of the first and second conductive portions.

In an embodiment, the first and second conductive portions include ends having different radiuses, so as to enable the molded clamshell enclosure to more readily grasp the ends of the first and second conductive portions.

In one embodiment, the molded clamshell enclosure is made of a rigid plastic.

In various embodiments, the fuse element is a wire element and/or the fuse element is soldered to the ends of the first and second conductive portions.

The embodiments described above and below, can be used in many different applications, such as with lighting systems or ballasts, electrical components such as power resistors, diodes, capacitors, inductors or conductors, metal transistors, varistors, connector bodies, strain relief units, etc.

Given the above embodiments and applications, it is therefore an advantage of the present disclosure to provide an electrical device, such as a lighting unit, having improved integral fuse protection.

Another advantage of the present disclosure is to provide an apparatus and method for integrating a fuse within an electrical device.

Moreover, it is an advantage of the present disclosure to provide a fuse that is controllably and repeatably manufactured.

Further still, it is an advantage of the present disclosure to provide a fused conductor having fuse opening characteristics that may be controlled precisely.

Yet another advantage of the present disclosure is to provide apparatuses and methods of making integrally fused conductors employing any one or more of thin film fuse technology, stamped fuse elements, glass-to-metal housing seals, fusing alloys, heat-shrink enclosures, intermediate sleeves surrounded by rigid enclosures, press-fit enclosures and clamshell type enclosures.

Still a further advantage of the present disclosure is to provide a shape memory alloy element configured to open the fused conductor upon an overcurrent condition.

Additional features and advantages of the present invention are described in, and will be apparent from, the following Detailed Description of the Invention and the figures.

BRIEF DESCRIPTION OF THE FIGURES

FIGS. 5A and 5B are top plan and side elevation views respectively of the conductor of FIGS. 3, 4A and 4B in a second stage of production.

FIGS. 7 to 10 are perspective views illustrating another embodiment of a fuse that may be integrated with an electrical device, such as an electroluminescent lamp unit.

FIGS. 17 to 19 are side elevation views illustrating one embodiment of a fused conductor, and method of making same, which includes a thin film fuse and a glass-to-metal seal.

FIGS. 33 to 38 are various views illustrating one embodiment of a fused conductor, which includes a stamped integral fuse element and press-fit housing and method of making same.

FIGS. 39 to 42 are side elevation views of a stamped fuse element having a fusing alloy and a method of making same.

FIG. 43 illustrates yet another embodiment of a fused conductor including a wire fuse element and a heat-shrink enclosure.

FIG. 51 illustrates one embodiment of a fused conductor having an element disconnected upon an over-temperature condition via a shape memory alloy element.

FIG. 52 illustrates another embodiment of a fused conductor, which opens upon an over-temperature condition via a shape memory alloy element.

FIGS. 53 and 54 illustrate yet a further embodiment for a fused conductor having a molded clamshell housing.

DETAILED DESCRIPTION

Figure 1A:
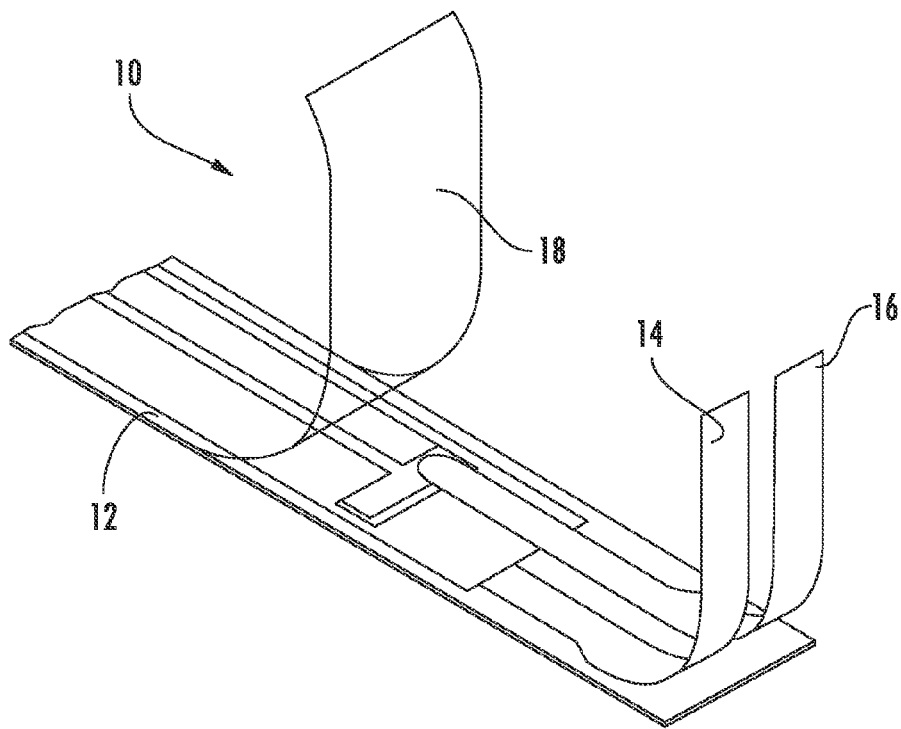
FIG. 1A is a prior art perspective view of a portion of a ribbon-type electroluminescent lamp unit.
Figure 1B:
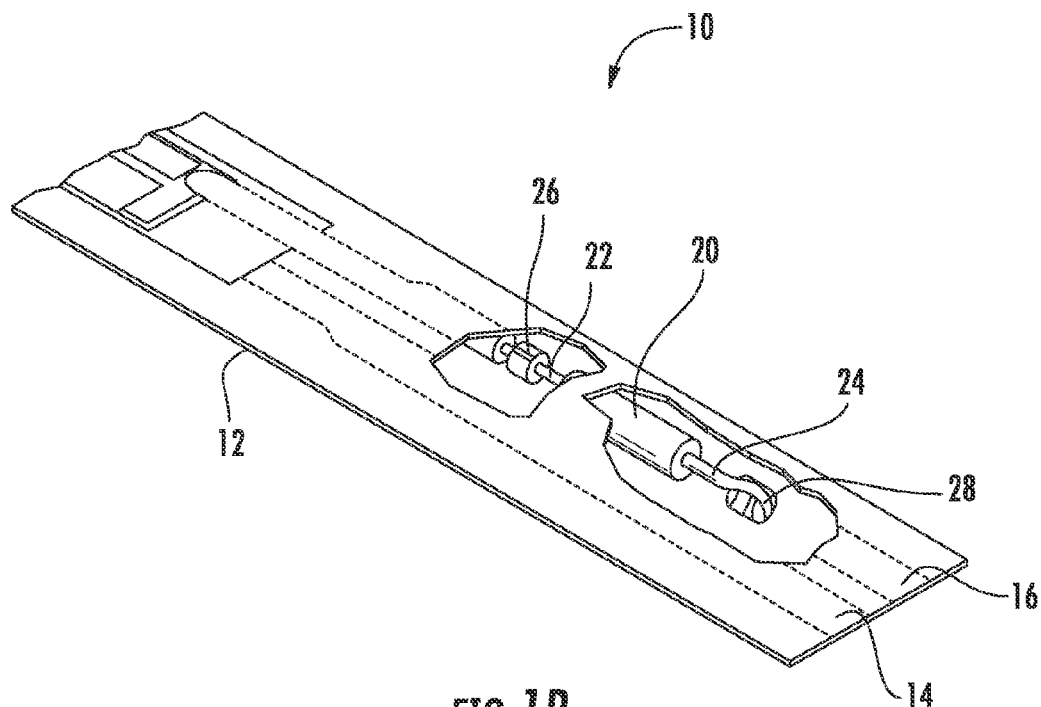
FIG. 1B is a prior art top perspective view of a portion of a fused electroluminescent lighting unit of the type shown in FIG. 1A.
Figure 1C:
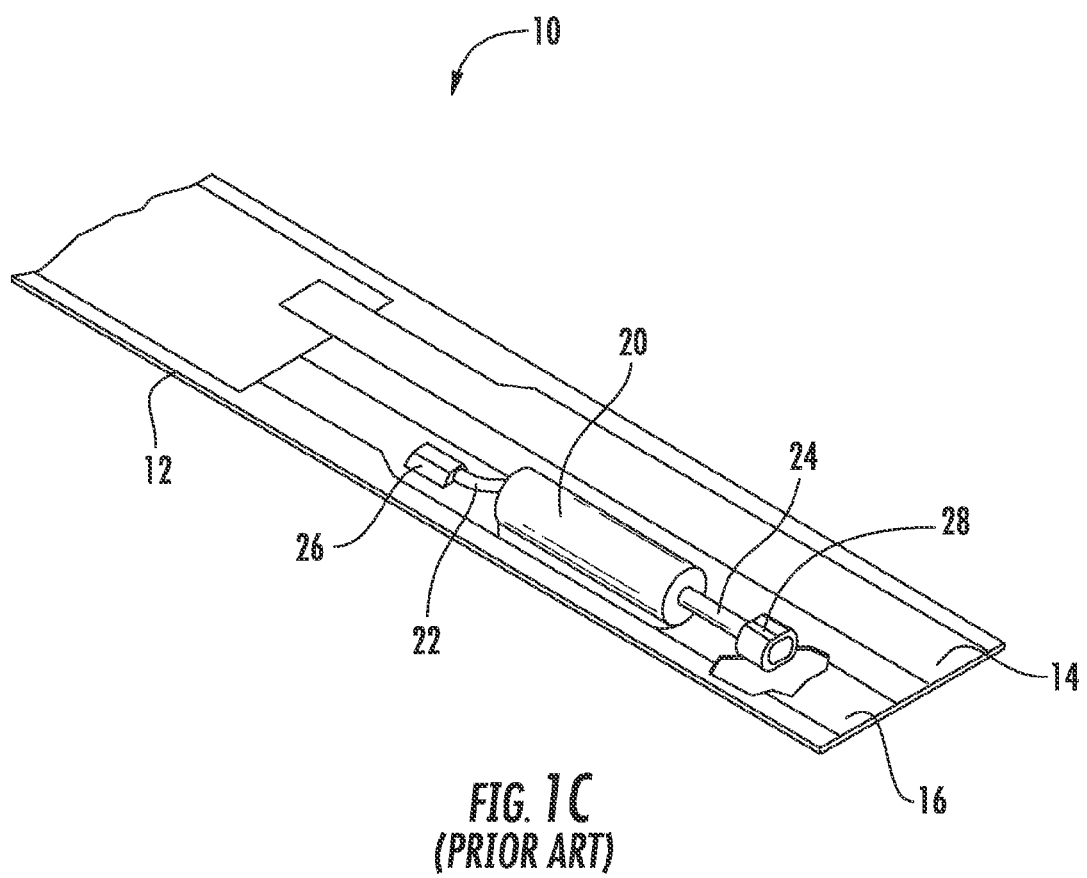
FIG. 1C is a prior art bottom perspective view of a portion of a fused electroluminescent lighting unit of FIG. 1B.
Figure 2A:
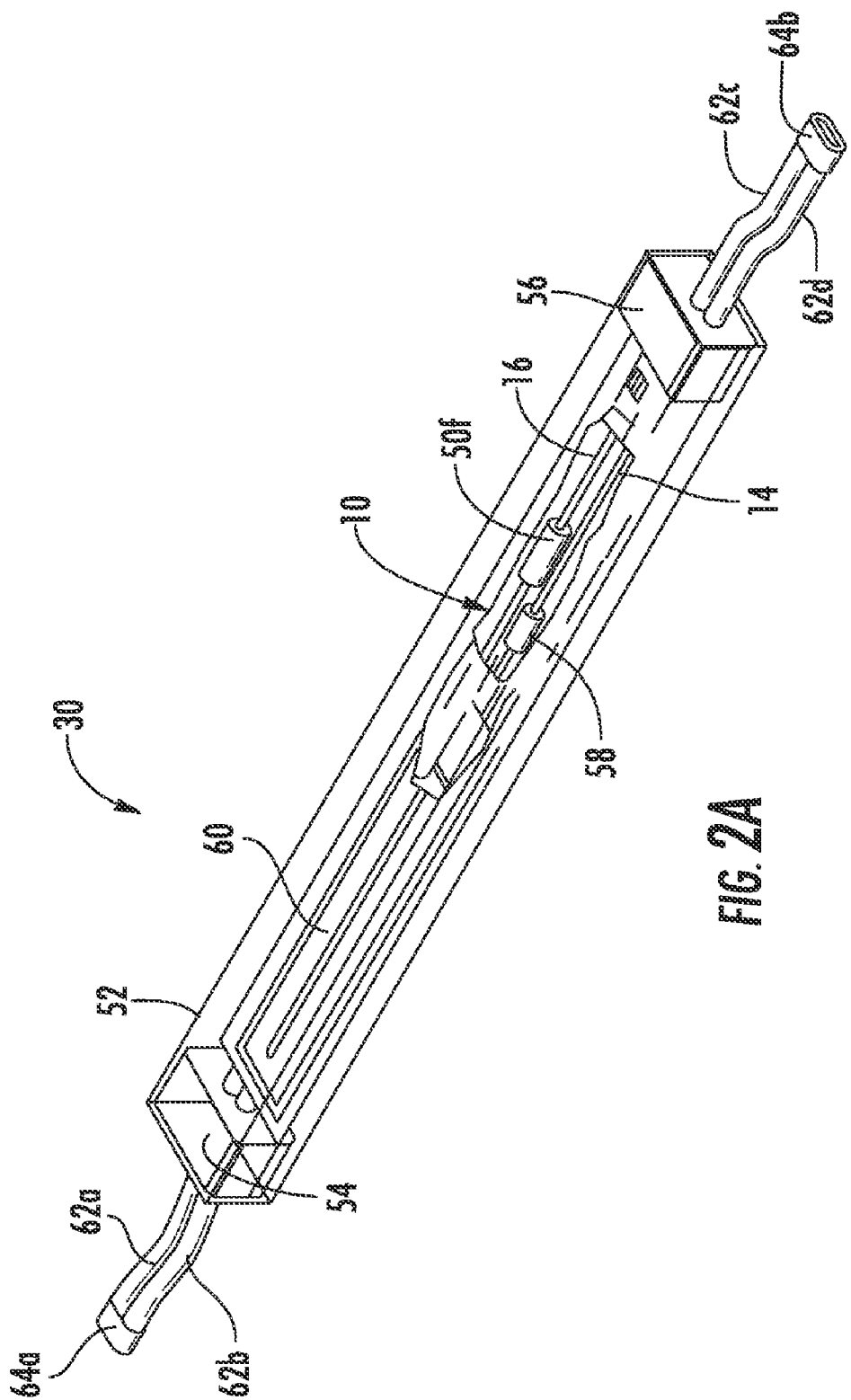
FIG. 2A is a top perspective view of a portion of an electroluminescent lighting unit of the type shown in FIG. 1A, which shows one example of ribbon-type fused conductor of the present invention.

Referring now to FIG. 2A, one embodiment of an electrical device, such as an electroluminescent lamp unit, having an integrated fuse element is illustrated by electroluminescent lamp unit 30. As seen, lamp unit 30 includes a housing 52. Housing 52 houses an electroluminescent lighting assembly 10, which is similar to the assembly 10 shown in FIGS. 1A to 1C. In one embodiment, lamp unit 30 is a modular lamp unit, which may be connected in series or parallel with other lamp units 30. Housing 52 includes at least one light-transmissive, transparent, translucent or see-through surface, e.g., in the form of an extruded tubular housing of resilient, translucent or transparent material (e.g. plastic tubing).

Housing 52 houses electroluminescent lamp 60. Lamp unit 30 and housing 52 can include any suitable size and type of lamp or light source 60, such as those having visible electromagnetic radiation, ultraviolet, near-ultraviolet, infrared, or other electromagnetic radiation. By way of example only, light source 60 may include an ultraviolet lamp element, which may be useful for the curing of resins, films and coatings. At least a portion of housing 52 is light-transmissive to accommodate light source 60.

Besides light source 60, housing 52 of unit 30 can house other circuitry 58 needed for unit 30. Circuitry 58 may be placed on a same substrate as lighting assembly 10, on a same substrate with light source 60 or on its own substrate. Similarly, the components of lighting assembly 10 may be placed on their own substrate or be combined with one or more of circuitry 58 and light source 60.

The generally elongated form of housing 52 in FIG. 1 is desired in certain applications, such as those in which lighting unit 30 is employed in a multi-unit array with multiple lighting units 30. Plugs 54 and 56 may be provided to close the ends of housing 52. Plugs 54 and 56 can define feed-through openings, which receive lead wires 62a to 62d. Lead wires 62a and 62b are joined at their ends to connector 64a. Similarly, wires 62c and 62d are joined at their ends to connector 64b. Connectors 64a and 64b enable lighting unit 30 to be connected to: (i) another lighting unit 30, or (ii) to a power supply, such as a battery, power cord or electrical generator. Alternatively, connectors 64 (referring collectively to connectors 64a and 64b) may be coupled to a header or wiring harness, so that lighting units can be connected in a parallel relationship to one another.

Lighting assembly 10 of lamp unit 30 in FIG. 2A includes a fuse assembly 50f connected integrally to or integral with one of the conductors 14 and 16 located on assembly 10. While only conductor 16 is shown to be fused integrally in FIG. 2A, conductor 14 or conductors 14 and 16 are fused in alternative embodiments. Fuse assembly 50f protects the circuitry and wiring of lamp unit 30 during overcurrent conditions. Fuse assembly 50f alternatively or additionally protects other lamp units 30 connected electrically in series or parallel to lamp unit 30 of FIG. 2A and isolates those lamp units 30 connected in parallel with the illustrated unit 30.

In one embodiment, fuse assembly 50f is located along its respective conductor 14 or 16 so as to be closer to the lead wires 62c and 62d connected to conductor 14 or 16. This configuration helps to prevent energy from being transferred along the remainder of conductor 14 or 16 towards the lead wire wires 62c and 62d and potentially separately connected lighting units 30 after fuse assembly 50f opens. It should be appreciated however that fuse assembly 50f may be located along different parts of conductor 14 or 16, for example, to emphasize protection of the load or light source 60 versus the protection of another unit 30 connected to unit 30 of FIG. 2A via a connector 64a or 64b.

Figure 2B:
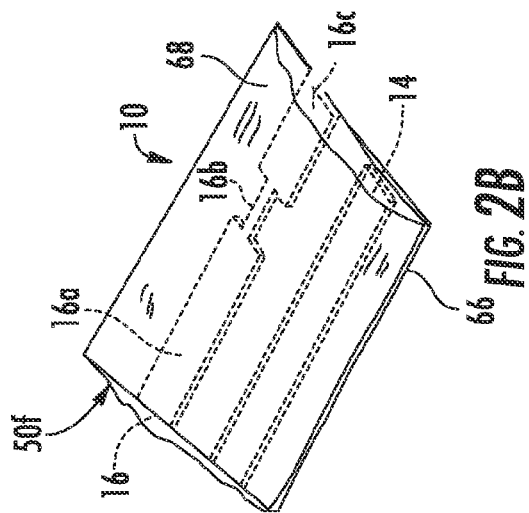
FIG. 2B is a perspective view of the ribbon-type fuse illustrated in FIG. 2A.

Referring now additionally to FIG. 2B, assembly 10 of unit 30 is shown in more detail. Assembly 10 includes a substrate 66. Substrate 66 can be any suitable insulator, such as an FR-4 material, ceramic, insulative polymer, glass or any combination of such materials. Substrate 66 can be a single layer or include multiple layers. Conductors 14 and 16 (shown as sections 16a to 16c) are deposited on substrate 66 via any suitable method, such as photo-etching, sputtering [any others].

For ease of illustration, only conductor 16 is shown to be fused integrally. Conductor 16 includes outer sections 16a and 16c and an inner thinned or fuse portion 16b. Inner thinned or fuse portion 16b may have any suitable shape, such as a straight shape, curved shape, serpentine shape, etc. Thinned portion 16b may be single or multi-stranded. A dissimilar metal may be placed on a part, e.g., middle, of thinned portion 16b to contribute to an "M" or Metcalf effect, which facilitates melting of the fuse portion 16b as the dissimilar metal diffuses into the base metal during an overload condition, increasing its electrical resistance, accelerating self-heating and reducing its melting temperature.

One suitable apparatus and method for forming conductors 14 and 16, including thinned fuse portion 16b, is illustrated in U.S. Pat. No. 5,943,764 ("the '764 patent"), issued Aug. 31, 1999, entitled, Method of Manufacturing a Surface-Mounted Fuse Device, assigned to the assignee of the present invention, the entire contents of which are incorporated herein by reference. Thinned portion 16b can be sized, e.g., in cross-sectional area, to open upon a desired amperage rating, which is set above the operating amperage of unit 30. One suitable length, width and height for thinned portion 16b may be 0.05 inch long, by 0.004 inch wide by 0.001 inch high. Cross-sectional dimensions for non-fused sections 16a and 16c may by comparison be 0.025 inch wide by 0.001 inch high.

Fuse portion 16b is advantageous because it provides the necessary overload protection, without requiring additional crimping or attachment devices. It maintains at least substantially the profile of non-fused conductor 14, so that fuse portion 16b does not create space or size issues. In the illustrated embodiment, a suitable insulative layer, laminate, film or encapsulant 68, such as one described above in the '764 patent is placed above conductors 14 and 16 to help confine arcing energy from an opening of thinned portion 16b and to protect conductors 14 and 16 and unit 30 generally, e.g., from environmental factors. In one embodiment, at least a portion of insulative layer, laminate or encapsulant 68 is light transmissive.

Assembly 10 and fuse portion 16b of FIGS. 2A and 2B are not limited to light unit 30 and may be integrated into many different electrical devices having circuit bearing substrates or printed circuit boards. Multiple fuse or thinned portions, such as portion 16b, may be placed on a same substrate to integrally protect multiple circuits within the electrical device.

Figure 3:
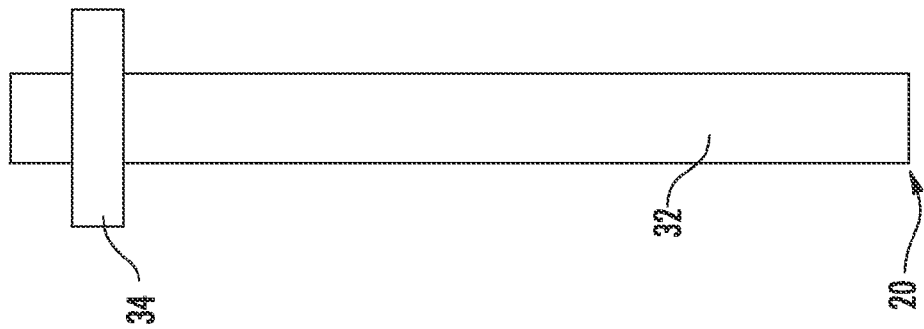
FIG. 3 is a side elevation view of a non-modified round or otherwise non-ribbon like conductor.

Referring now to FIGS. 3, 4A, 4B, 5A, 5B, 6A and 6B an alternative embodiment of the present invention is illustrated. Here, an integrally fused conductor 20 is at least substantially circular or rectangular in cross-section and can be disposed in a free hanging or freely disposed arrangement, as opposed to the metal foil conductors 14 and 16 of FIGS. 2A an 2B, which are fixed to substrate 66. FIG. 3 illustrates conductor 20 prior to being fused. Conductor 20 can have any suitable shape and size depending on the application.

In the illustrated embodiment, conductor 20 includes a stem 32 and a head 34. Stem 32 and head 34 of conductor 20 may be of a same or different type of metal, such as brass, bronze or other suitable metal. The stem 32 can also be tin-plated. Head 34 is provided at the end of conductor 20, for example to be fixed to a terminal of a device into which conductor 20 is to be employed. Head 34 can be stamped or riveted to secure conductor 20 to the terminal of the device into which conductor 20 is to be employed. Head 34 can also act as a stop that helps to locate conductor 20 within the device into which conductor 20 is to be employed.

Figure 4B:
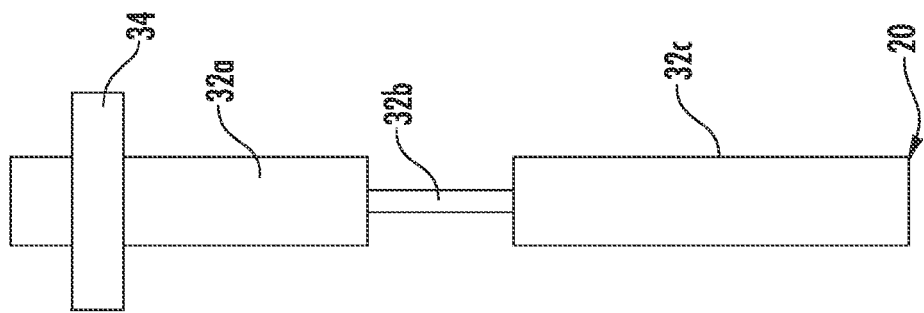
FIGS. 4A and 4B are top plan and side elevation views respectively of the conductor of FIG. 3 during one stage of production for one embodiment of the integrated fuse.
Figure 4A:
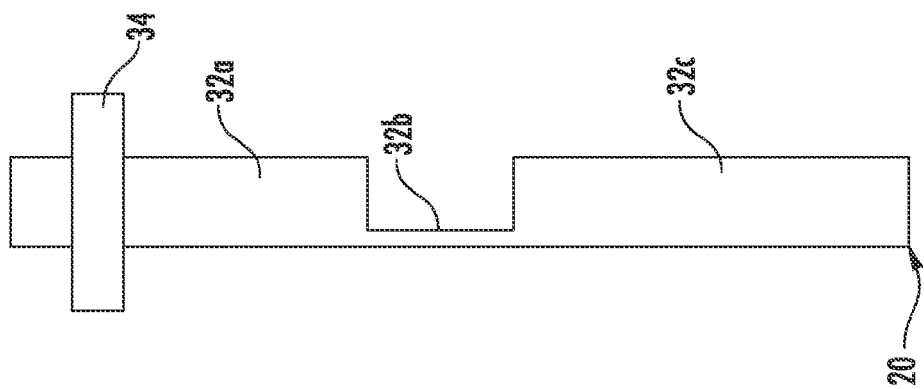

FIGS. 4A and 4B are top and side views respectively of one embodiment of an integral fuse during a first portion of production. Here, a fuse or thinned portion of conductor 20 is formed by grinding, coining, stamping or milling a flat or narrowed portion 32b of the stem 32 (including sections 32a to 32c) shown in FIG. 3. Thinned portion 32b separates proximate and distal sections 32a and 32c, respectively, of stem 32 of conductor 20. Fuse portion 32b is thinned to a desirable thickness, such as 0.001 to 0.01 inch.

In the embodiment illustrated in FIGS. 4A and 4B, thinned portion 32b is ground or milled from one side of stem 32. This operation is advantageous in one aspect if stem 32 is cylindrical because the thickness as well the width of thinned or fuse portion 32b is reduced due to the roundness of stem 32. Also, if stem 32 is plated, such as tin-plated, grinding or milling one side of stem 32 leaves the plating on the outer surface of fuse portion 32b. The plating helps contribute to the "M" or Metcalf effect mentioned above, which facilitates melting of the fuse portion 32b as the tin diffuses into the base metal during an overload condition, thereby increasing its electrical resistance and accelerating self-heating, while reducing its melting temperature.

As seen in FIGS. 4A and 4B, portion 32b may alternatively be machined so that it resides instead in the substantially middle portion of stem 32. Alternatively, fuse or thinned portion 32b is ground, milled or coined so that the element is at one side of the cross-section of stem 32. Fuse portion 32b may be machined in any number of directions or dimensions, to have any desired cross-sectional shape, length, width and thickness to provide any suitable electrical opening characteristics, such as the amperage at which the fuse opens and $I^2R$ characteristics.

Referring now to FIGS. 5A and 5B, a second step in the process of preparing one embodiment of an integrated fuse is illustrated. Here, fuse portion 32b is bent or kinked inward towards the center of conductor 20. Bending or kinking portion 32b inward causes the element to be more centered within housing 18, which results in faster and more consistent opening characteristics. Also, for the same overall length of conductor 20, the effective length of portion 32b is increased. Increasing the length of portion 32b enables the thickness or cross-sectional area of portion 32b to be bigger, which makes for an overall more robust fuse. The bending of fuse portion 32b also enables the housing into which conductor 20 is placed to have inwardly projecting arc barriers that extend into the triangular voids formed by portion 32b.

Figures 6A, 6B:
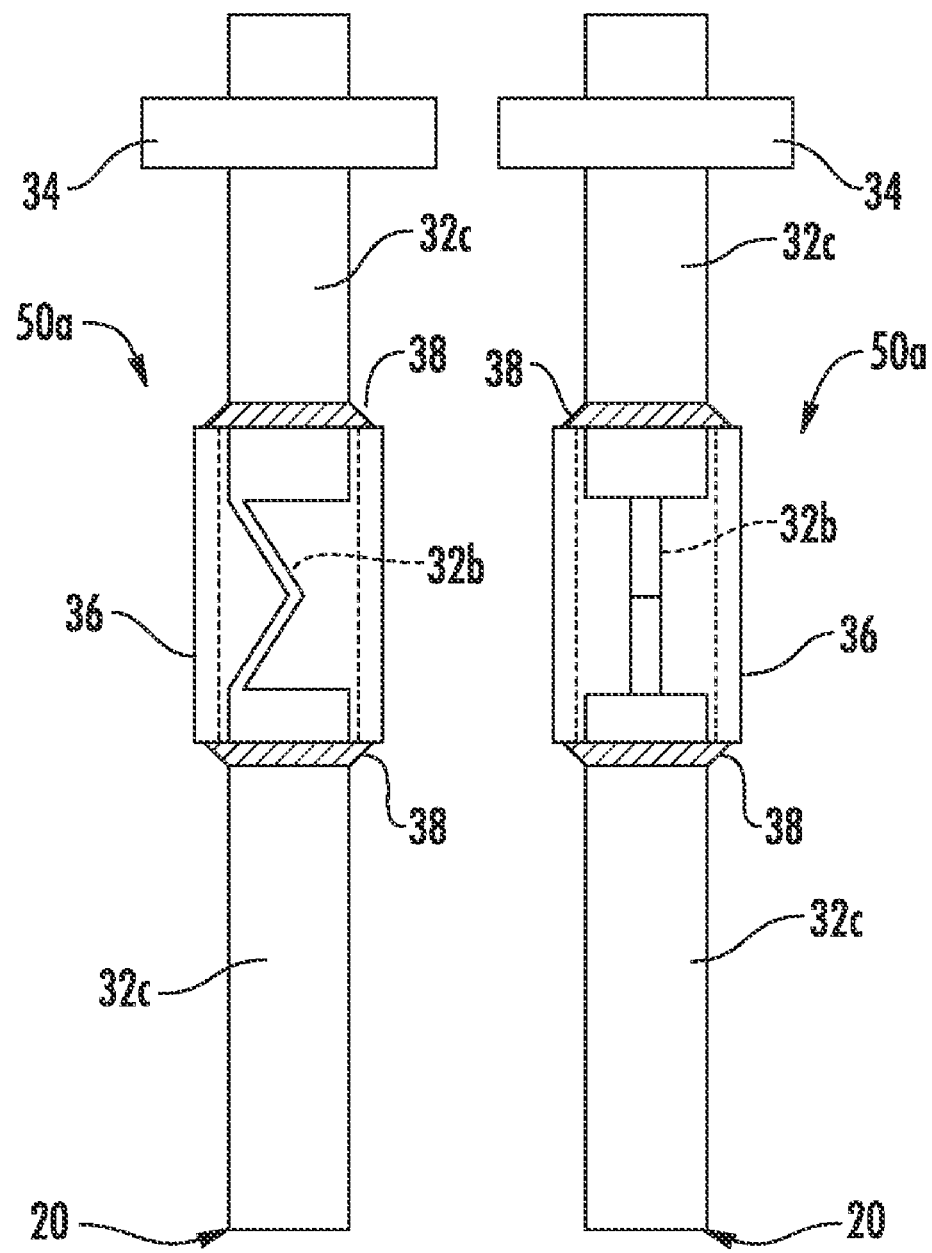
FIGS. 6A and 6B are top plan and side elevation views respectively of the conductor of FIGS. 3, 4A, 4B, 5A and 5B showing a finished integral fuse.

Referring now to FIGS. 6A and 6B, top and side views of a completed fuse assembly 50a (fuse assemblies 50a to 50t discussed herein are referred to collectively as fuse assemblies 50 or generally as fuse assembly 50) are illustrated, respectively. Fuse assembly 50a includes an insulative enclosure 36, such as a glass, ceramic or plastic enclosure. Enclosure 36 provides electrical insulation and strength and rigidity to the overall integrated fuse assembly, which includes fuse assembly 50a and sections 32a and 32c of conductor 20. As discussed, thinned or fuse portion 32b of conductor 20 serves in this embodiment as the fuse element of fuse assembly 50a.

FIGS. 6A and 6B also illustrate that enclosure 36 is secured to conductor 20 via an adhesive 38, such as a two part epoxy. For assembly, enclosure 36 is slid over the ends of sections 32a and 32c of conductor 20 and located at least approximately centrally over fuse portion 32b. Adhesive 38 is then applied to both ends of enclosure 36 to seal fuse portion 32b from the outside environment. In any of the embodiments described herein, enclosure 36 is alternatively or additionally sealed to section 32a and 32c via mechanical press fitting, induction heating, radiant heating, laser heating, and/or ultrasonic energy.

The assembled structure shown in FIGS. 6A and 6B can be incorporated into any suitable electrical device, such as, the lighting unit discussed above, test and measurement equipment, power supplies, transformers, connectors, wire harnesses, lighting ballasts and military components. Although fuse assembly 50a is illustrated as being relatively centrally located on conductor 20 in FIGS. 6A and 6B, fuse assembly 50a is alternatively located closer to head 34 of conductor 20 as shown in FIG. 2A.

Fuses 50f and 50a of FIGS. 2B and 6A/6B, respectively, include fuse portions made at least substantially completely by thinning a portion of the fused conductor. The present invention is expressly not so limited. Referring now to FIGS. 7 to 10, an alternative integrally attachable fuse assembly 50b is illustrated, which includes a fuse portion formed partially from a thinning of the fused conductor and a fuse element 40. The overall assembly includes many of the same features described above for the assembly employing fuse assembly 50a. Again, conductor 20 is divided into sections 32a, 32b and 32c. Section or portion 32b is thinned via a coining, stamping, milling or grinding process. As seen in FIGS. 7 to 9, thinned or fuse portion 32b is positioned roughly centrally within conductor 20 (but may alternatively be located to one side of conductor 20 as discussed in connection with fuse assembly 50a).

FIG. 8 illustrates a second stage in the production of integral fuse assembly 50b. Here, a gap is stamped, machined, chemically etched, wire EDM'd, or is otherwise made in thinned portion 32b to create two thinned sections 32b1 and 32b2, which are separated by a gap (labeled in FIGS. 8 and 9). The gap may be formed in conductor 20 as above via stamping, machining, chemical etching, wire EDM, etc. The gap is maintained through the resulting production of fuse assembly 50b in FIG. 10.

As seen in FIG. 9, a thinned conductor or fuse element 40 is attached to thinned sections 32b1 and 32b2 of conductor 30 across the gap. Fuse element 40 in the illustrated embodiment is a wire element, such as a single, multi-stranded, braided or chain-linked element. Such element may include a dissimilar metal or tin coating to enhance its opening characteristics. In alternative embodiments, fuse element 40 of fuse assembly 50*b* is a flat sheet of metal or otherwise has any suitable shape. Fuse element 40 is connected to thinned sections 32*b*1 and 32*b*2 via ultrasonic bonding, welding, soldering, etc. Fuse element 40 in combination with thinned sections 32*b*1 and 32*b*2, like fuse portion 32*b* of fuse assembly 50*a*, is sized and dimensioned to provide any suitable electrical fuse opening characteristics. Fuse assembly 50*a* may be used in many different types of electrical devices, such as lamp unit 30 described above in connection with FIG. 2A As seen in FIG. 10, fuse assembly 50*b* is completed when enclosure 36 is slid over the ends of distal sections 32*a* and 32*c* of conductor 20 and centered about the combined length of thin portions 32*b*1 and 32*b*2 and the gap width. Enclosure 36 is then mechanically, electrically, chemically and/or thermally secured to sections 32*a* and 32*c* of conductor 20 via any of the methods and apparatuses discussed above. Sections 32*a* and 32*c* are held apart during the securing process so that the gap width is maintained. Housing 36 provides electrical insulation and mechanical rigidity and stability to the assembly of integrated fuse assembly 50*b* and conductor 20. Fuse assembly 50*b* is located at any desirable position along stem 32 of conductor 20 as has been described herein. The assembled structure shown in FIG. 10 can be incorporated into any suitable electrical device, such as, the lighting unit discussed above, test and measurement equipment, power supplies, transformers, connectors, wire harnesses, lighting ballasts and military components.

Figure 11:
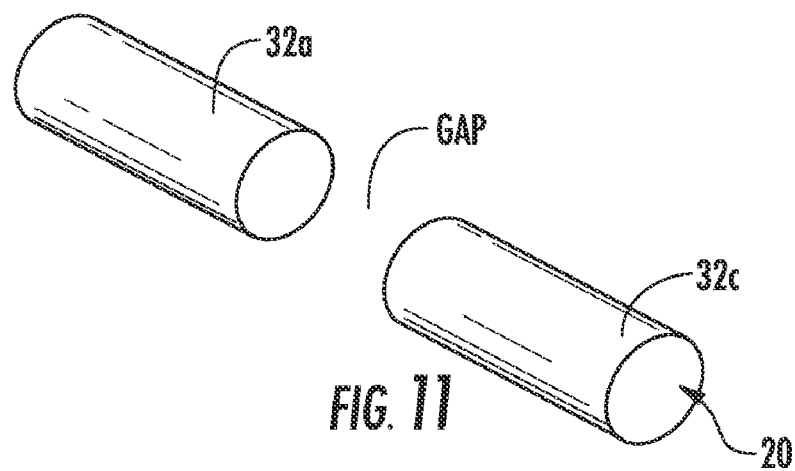
FIGS. 11 and 12 are perspective views illustrating a further embodiment of a fuse that may be integrated with an electrical device, such as an electroluminescent lamp unit.
Figure 12:
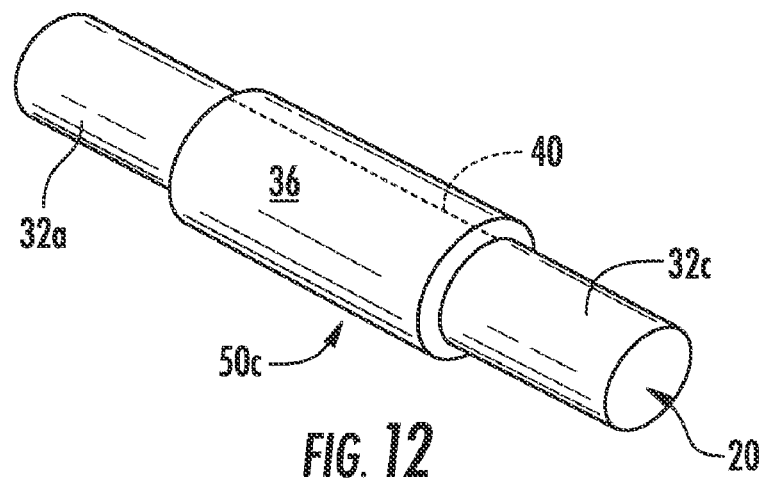

Referring now to FIGS. 11 and 12, another alternative embodiment is illustrated by integrally attachable fuse assembly 50*c*. Here, no portion of conductor 20 is thinned. Instead, fuse assembly 50*c* is shown integrated with sections 32*a* and 32*b* of conductor 20. It should be appreciated however that fuse assembly 50*c* as will become apparent is also assembled to conductor 20 in a manner that does not require extra crimping devices, and which may be used in many different types of electrical devices, such as lamp unit 30 described above in connection with FIG. 2A. The previous fused conductors formed or attached the fuse portion or fuse element to sections 32*a* and 32*c* of conductor 20 prior to the attachment of enclosure 36. A difference here is that the thinned conductive portion or fuse element 40 may be provided on and carried with housing 36 of fuse assembly 50*c* prior to assembly. Accordingly, fuse assembly 50*c* may be packaged and sold as a stand-alone fuse.

As seen in FIGS. 11 and 12, a gap is maintained between sections 32*a* and 32*c*. Portion 32*b* is eliminated completely. The gap may be formed in conductor 20 as above via stamping, machining, chemical etching, wire EDM, etc. Housing 32*c* is equipped with the thinned conductor or fuse element 40. As seen in FIG. 12, element 40 is attached to an inner wall of enclosure 36. Sections 32*a* and 32*c* may alternatively be formed separately. Fuse element 40 may be a wire fuse element (with any suitable plating) as described above or be of a flat piece of metal. Further, fuse element 40 may be imbedded into a thin longitudinal groove defined on the inner wall of enclosure 36. Alternatively, the inner wall of enclosure 36 is continuous and element 40 extends slightly inward into the opening of enclosure 36.

The gap space is maintained while enclosure 36 is slid over and thermally, electrically, mechanically and/or chemically attached to one end of each sections 32*a* and 32*c* of conductor 20. In particular, one end of enclosure 36 is connected and/or sealed to section 32*a* of conductor 20, while the other end of enclosure 36 is connected and/or sealed to section 32*c* of conductor 20 as seen in FIG. 12. Enclosure 36 is connected and/or sealed to conductor 20 via any of the methods described herein. The assembled structure shown in FIG. 12 can be incorporated into any suitable electrical device, such as, the lighting unit discussed above, test and measurement equipment, power supplies, transformers, connectors, wire harnesses, lighting ballasts and military components.

Figure 13:
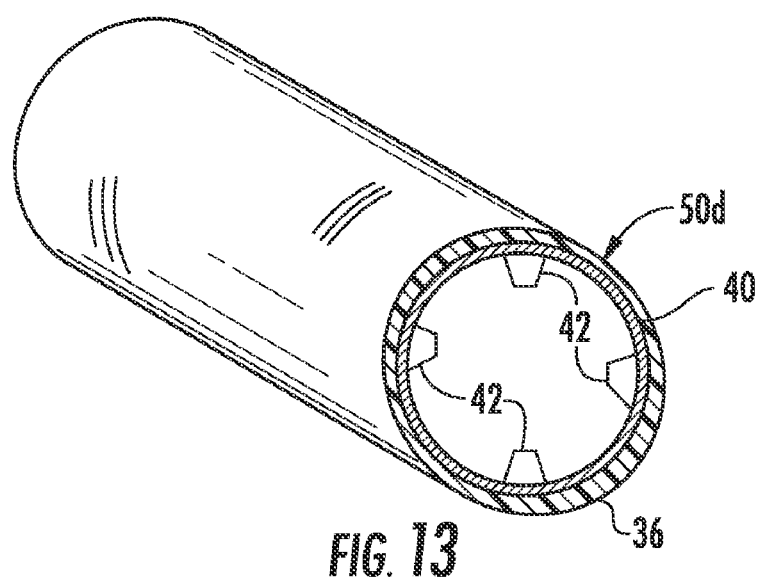
FIG. 13 is a side sectional view illustrating still another embodiment of a fuse that may be integrated with an electrical device, such as an electroluminescent lamp unit.

Referring now to FIG. 13, one preferred fuse is illustrated as fuse assembly 50*d*. Fuse assembly 50*d*, like fuse assembly 50*c*, carries or supports a thinned conductor or fuse element 40. Fuse assembly 50*d*, which can be cylindrical, rectangular or have any suitable cross-sectional shape, may therefore be packaged and sold separately from the electrical device to which it will be connected integrally.

Fuse element 40 of fuse assembly 50*d* is a metallized or plated thickness of metal or metals on an inner surface of insulative housing 36 in the illustrated embodiment. Insulative housing 36 is plastic, ceramic, glass or any combination thereof. The metallization or plating is provided in a thickness or overall volume that yields desired electrical opening characteristics, such as a particular amperage rating and/or desired melting characteristics.

Electrodes or conductors (not illustrated) of an electrical device are slid, e.g., mechanically press-fitted into fuse assembly 50*d*, causing the electrodes to communicate electrically with fuse element 40. To that end, internal standoffs 42 may be provided on one or both sides (or the middle) of enclosure 36 as stops against which the electrodes abut when inserted the proper or desired distance into enclosure 36. Alternatively, the gap width between the electrodes is controlled via monitored movement and positioning of electrodes within fuse assembly 50*d*. Enclosure 36 and/or element 40 is then fixed to the electrodes via a conductive adhesive, laser heating, radiant heating, inductive heating, ultrasonic energy, mechanical press fitting or any combination thereof.

In one embodiment, element 40 is provided over substantially all of the inner surface of housing 36 of fuse assembly 50*d* via a plating, sputtering or other suitable process. Alternatively, element 40 is metallized to have a desired pattern on the inner surface of housing 36. Further, while element 40 is shown adhered to the inner surface of housing 36, element 40 is alternatively or additionally plated onto a portion or all of the outer surface of housing 36 of fuse assembly 50*d* (In such case, fuse assembly 50*d* is slid into conductors 32*a* and 32*c*). As discussed herein, fuse assembly 50*d* may be employed with lamp unit 30 shown in FIG. 2A or any other suitable fusible electrical device.

Figure 14:
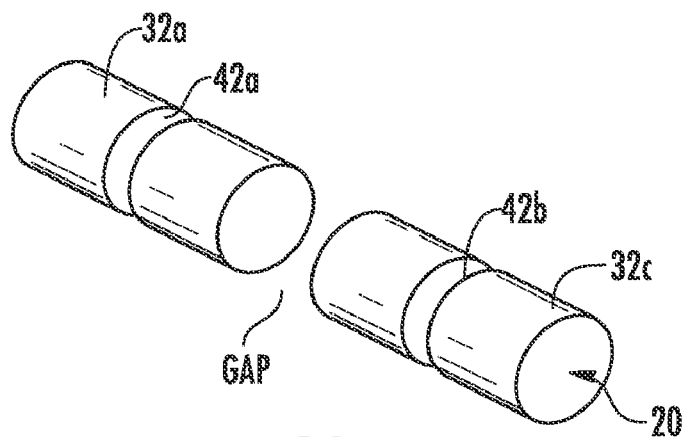
FIGS. 14 to 16 are perspective views illustrating yet a further embodiment of a fuse that may be integrated with an electrical device, such as an electroluminescent lamp unit, during various stages of production.
Figure 15:
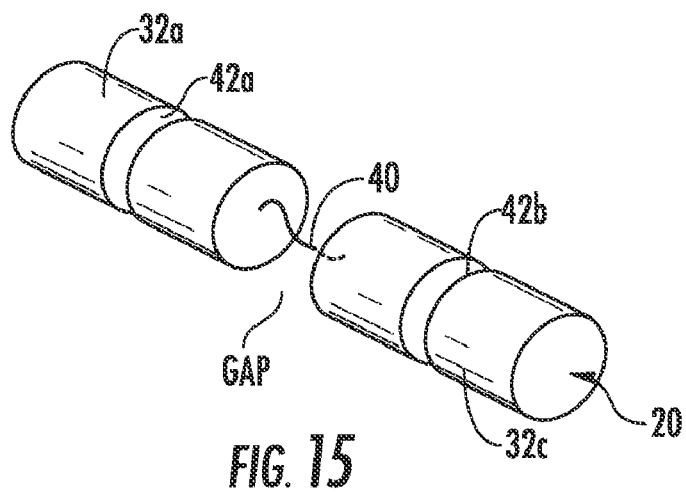
Figure 16:
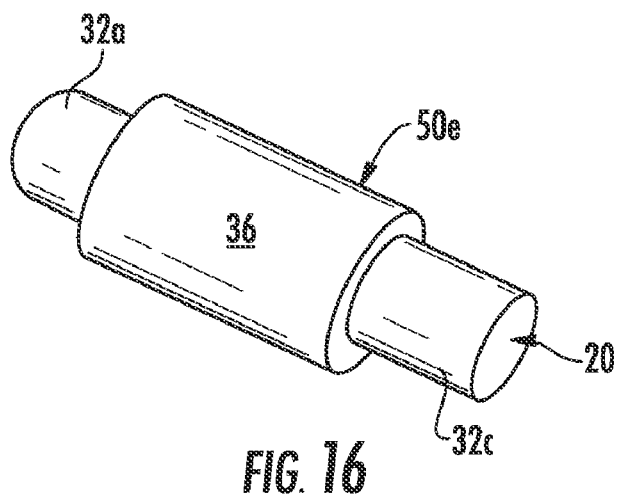

Referring now to FIGS. 14 to 16, a further alternative fuse assembly 50*e* is illustrated. Fuse assembly 50*e* is similar to the previous fuse assembly 50*d* and fuse assembly 50*b* of FIGS. 7 to 10. Element 40 (like that used in Fuse assembly 50*b*) of fuse assembly 50*e* is secured instead to machined ends (like those of fuse assembly 50*d*) of sections 32*a* and 32*c* of conductor 20, not to thinned sections 32*b*1 and 32*b*2 in FIGS. 7 to 10. The result in both cases is to provide and maintain a gap between sections 32*a* and 32*c*. Also, as seen in FIGS. 14 and 15, grooves 42*a* and 42*b* are made respectively in sections 32*a* and 32*c* of conductor 20. Grooves 42*a* and 42*b* help maintain the gap distance when enclosure 36 is fixed onto sections 32*a* and 32*c*. Element 40 is shown as a filament wire but can alternatively be any of the elements described herein. Filament wire 40 is welded, soldered, ultrasonically bonded or otherwise suitably electrically attached to sections 32*a* and 32*c*.

Enclosure 36 is slid over and thermally, mechanically and/or chemically attached to one end of each section 32a and 32c of conductor 20. Enclosure 36 can include inwardly projecting mating protrusions (not illustrated) that snap-fit into grooves 42a and 42b. Alternatively, enclosure 36 is made of a suitable material, such as heat-shrink tubing, that when heated fills grooves 42a and 42b. In any case, the filling of grooves 42a and 42b provides axial strength and sealing for fuse assembly 50e. Additionally, any of the methods and apparatuses disclosed herein for connecting enclosure 36 to sections 32a and 32c is applicable with fuse assembly 50e.

Fuse assembly 50e may be employed with lamp unit 30 or any suitably fusible electrical device. Further, grooves 42a and 42b may be provided with any of the fuses 50 described herein. Still further, enclosure 36 may include grooves, while sections 32a and 32c include mating projections.

Referring now to FIGS. 17 to 19, a fuse assembly 50g and method of making same is illustrated. In this embodiment, fuse assembly 50g employs a thin film fuse 70 and a glass-to-metal seal. As before, and as seen in FIG. 3, the process begins with a conductor 20 which is to be fused. Conductor 20 can have any suitable shape and size depending on the application. Conductor 20 includes a stem 32 and a head 34. Stem 32 and head 34 of conductor 20 may be of a same or different type of metal, such as brass, bronze or other suitable metal. The stem 32 can also be tin-plated. Head 34 includes each of the alternative functions and features described above in connection with FIG. 3.

In FIG. 17, a central portion (32b not seen) of conductor 20 is removed, leaving outer portions 32a and 32c of the conductor. Next, dual metal wires 44a and 44b are welded, such as butt-welded, to the inner ends of portions 32a and 32c. Wires 44a and 44b can be any type of wires suitable for forming a glass-to-metal seal. In an embodiment, wires 44a and 44b are a dumet type, which can be round copper-coated nickel-iron wire. Dumet wire is advantageous because it is compatible with many types glasses to make a seal that is chemically sound. Also, the dumet wire has thermal expansion properties that match well with those of glass. Wires 44a and 44b in an embodiment are 0.02 inch (0.5 mm) in diameter by 0.04 inch (1 mm) long.

In an alternative embodiment, outer portions 32a and 32c of the conductor are themselves suitable to make a glass-to-metal seal, for example, the portions 32a and 32c can be a dual metal or dumet type. Here, separate dumet wires 44a and 44b are not needed. Portions 32a and 32c can alternatively be copper, e.g., oxygen-free copper, which can be sealed to certain types of glasses and ceramics, such as leaded glass.

As seen in FIG. 18, a glass body 46 and a fuse 70 are added between portions 32a and 32c. Fuse 70 in one embodiment is a thin film fuse, provided by the assignee of this application, which can be similar to its 0603 chip fuse. Fuse 70 can have a single substrate layer 72, which is plated on one side, e.g., via a copper plating 74. The plating 74 thins in its center at a point 76 configured to open upon a particular current and/or $i^2R$ rating. The substrate 72 of fuse 70 in one embodiment is made of a suitably electrically non-conducting material, such as an FR-4 material, ceramic, glass, polyimide or polyester. The substrate 72 can be at least substantially rectangular and be made relatively simply, e.g., without plating holes or vias because only one side needs to be plated. Similarly substrate may not need markings typically associated with such substrates.

Body 46 is cylindrical in one embodiment but can have any suitable shape based on the cross-sectional shape of portions 32a and 32c of conductor 20. Body 46 is glass in one preferred embodiment but is alternatively ceramic.

Wires 44a and 44b can be soldered to the plated surfaces 74 of fuse 70. Alternatively, if wires 44a and 44b are not used because portions 32a and 32c are compatible with glass body 46, portions 32a and 32c are soldered directly to the plated surfaces 74 of fuse 70.

Alternatively or additionally, glass body 46 press-fits the conductive surfaces of fuse 70 to wires 44a and 44b (or portions 32a and 32c of the conductor), so that soldering may not be needed. If connected to portions 32a and 32c directly, the inner ends of portions 32a and 32c can be reduced in diameter to create stops against which fuse 70 abuts when inserted over the reduced diameter ends (similar to stops created by wires 44a and 44b, which are shown to have smaller diameters than portions 32a and 32c in FIG. 18).

The unheated inner diameter of body 46 is roughly the same as (slightly bigger than) the outer diameter of wires 44a and 44b. After body 46 is slid over wires 44a and 44b, heat is applied to body 46, e.g., raising the temperature of body 46 to a temperature of about 600 to about 700° C. The temperature could alternatively be raised to higher temperatures, even above 1000° C., however. Heat causes glass body 46 to collapse and provide a compressive force to wires 44a and 44b and fuse 70, crimping wires 44a and 44b to the plated portions 74 of fuse 70. The collapsed outer diameter of body 46 can be flush with or larger than the outer diameters of portions 32a and 32c or be slightly larger as shown in FIG. 19. It should also be appreciated that the compressive forces provided by the shrinkage of glass cap 78 may dictate that substrate 72 have a certain rigidity, e.g., that of a ceramic material.

Alternatively, the beginning inner diameter of body 46 is roughly the same as (slightly bigger than) the outer diameter of collector portions 32a and 32c. Here, the diameter of dumet wires 44a and 44b may be closer to that of portions 32a and 32c. Or, the case may be that wires 44a and 44b are not being used. Heat is again applied to glass body 46, causing it to collapse and provide a compressive force to portions 32a and 32c and to wires 44a and 44b/fuse 70.

Figure 22:
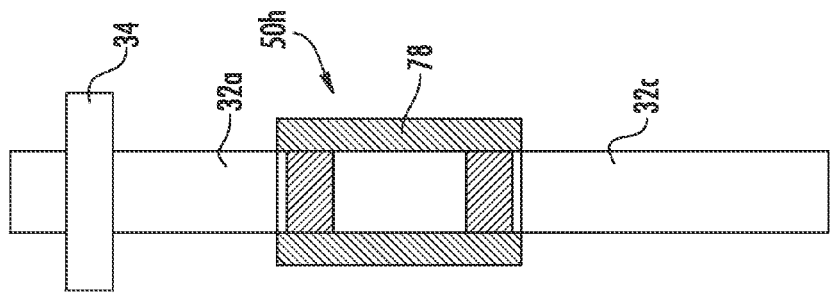
FIGS. 20 to 22 are various views illustrating another embodiment of a fused conductor including a thin film fuse fitted within slotted conductor portions and method of making same.
Figure 20:
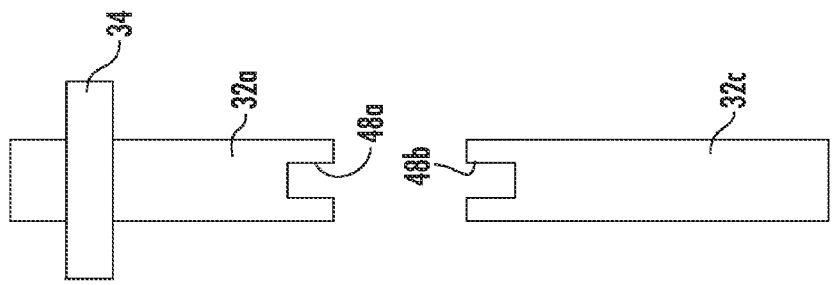

Referring now to FIGS. 20 to 22, a further alternative fuse assembly 50h and method of making same is illustrated. In this embodiment, like with fuse assembly 50g, fuse assembly 50h employs a thin film fuse 70. Assembly 50h employs a nylon or epoxy cap 78 in one embodiment but can use a glass or ceramic cap alternatively. As before, and as seen in FIG. 3, the process begins with a conductor 20 which is to be fused. Stem 32 and head 34 of conductor 20 include each of the alternative functions and features described above in connection with FIG. 3.

In FIG. 20, a central portion (32b not seen) of conductor 20 is removed, leaving outer portions 32a and 32c of the conductor. Next, slots 48a and 48b are machined into the inner ends of portions 32a and 32c. Slots 48a and 48b in an embodiment are 0.02 inch (0.5 mm) wide by 0.04 inch (1 mm) deep.

Figures 21A, 21B:
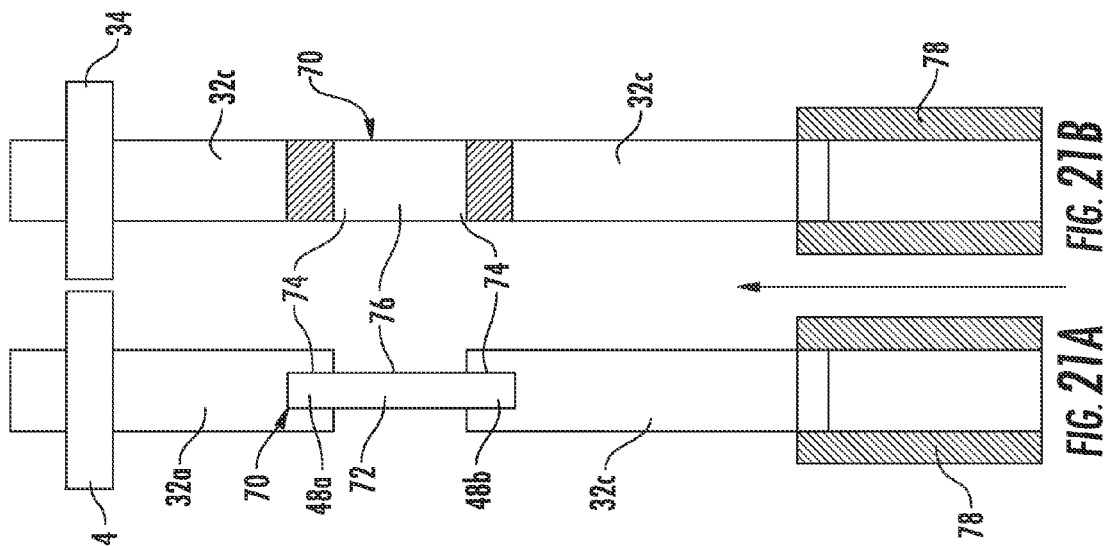

As seen in two different views in FIGS. 21A and 21B, a fuse 70 is fitted into slots 48a and 48b. Fuse 70 in one embodiment is the same thin film fuse 70 described above, provided by the assignee of this application, which can be similar to its 0603 chip fuse. Fuse 70 can have a single substrate layer 72, which is plated on one side, e.g., via copper plating 74. Plating 74 is thinned to form a fuse element 76, which is configured to open upon an overcurrent condition.

Substrate 72 of fuse element 70 in one embodiment is made of a suitably electrically non-conducting material, such as an FR-4 material, ceramic, glass, polyimide or polyester. Substrate 72 can be at least substantially rectangular and be made relatively simply without mounting holes or markings as described above.

Fuse 70 in one embodiment is soldered or otherwise joined metallurgically to portions 32a and 32c of conductor 20. For example, solder paste can be applied to conductive platings or pads 74. Fuse 70 and portions 32a and 32c are then passed through a reflow oven, which melts the solder on the pads 74 causing an intermetallic bond to occur between pads 74 and portions 32a and 32c.

Next, fuse 70 is encapsulated. In one embodiment, fuse 70 is encapsulated with an epoxy coating 78. In another embodiment, it is encapsulated with a nylon cap 78. To encapsulate fuse 70 with an epoxy coating, for example, fuse 70 can be heated and then dragged through a fluidized bed of powdered epoxy. The epoxy coats the heated fuse portion 70 of subassembly 50. This step can be repeated several times to build up a coating 78 of epoxy on fuse 70, which has a desired thickness. Suitable epoxies for coating 78 is provided for example Henkel-Loctite (Irvine, Calif.) and Daejoo (Seoul, South Korea).

In an alternative embodiment, nylon is adhered around fuse 70 to form cap 78. A suitable adhesive for adhering nylon cap 78 is for example Hysol™ epoxy adhesive provided Henkel-Loctite. The nylon in an embodiment is provided as a strip that is wrapped around and adhered to fuse 70 and/or inner ends of portions 32a and 32c. Alternatively, nylon in an embodiment is provided as a tube that is pulled over portion 32b and adhered to fuse 70 and/or inner ends of portions 32a and 32c. Cap 78 in any embodiment shown herein can be a cast or molded plastic material.

In a further alternative embodiment, cap 78 is made of a glass, which is suitable for sealing chemically to the material of the inner ends of portions 32a and 32c, which can be copper or oxygen-free copper for example. Here, as opposed to one of the embodiments described above for assembly 50g, dumet wires are not used. Also, the coupling of fuse 70 to portions 32a and 32c does not need to rely on the compressive force provided by the shrinkage of a glass cap. The coupling is done via the solder joints as described above.

The application of assembly 50h can determine whether cap 78 is epoxy, nylon or glass. Certain applications may be chemically incompatible with glass (or certain types of glass) or epoxy (or certain epoxies) for example. The nylon cap 78 is generally inert to most harsh chemical applications. However, the adhesive used to attach nylon cap 78 to assembly 50h should also be inert to the application chemical or suitably protected from the chemical.

Figure 25:
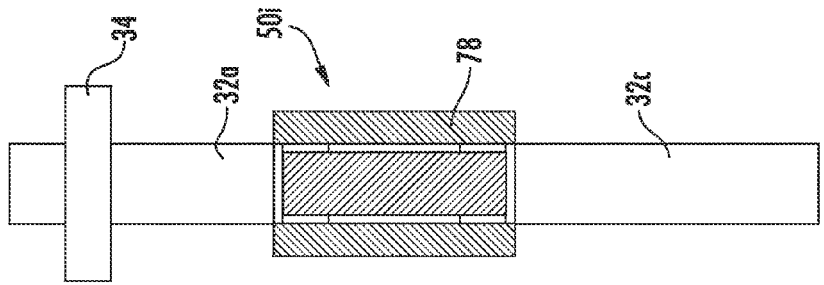
FIGS. 23 to 25 are various views illustrating a further embodiment of a fused conductor including a thin film fuse bonded metallurgically to notched conductor portions and method of making same.
Figure 23:
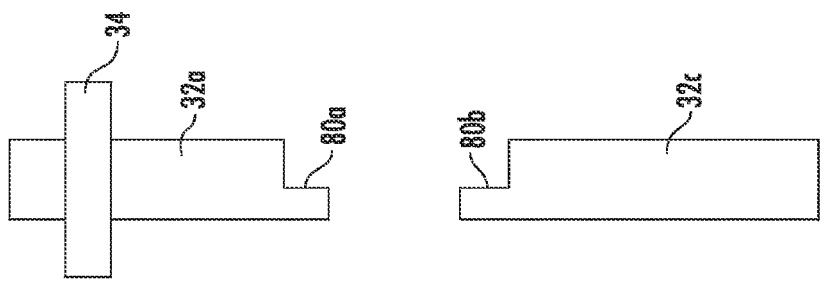

Referring now to FIGS. 23 to 25, a further alternative fuse assembly 50i and method of making same is illustrated. In this embodiment, like with fuse assemblies 50g and 50h, fuse assembly 50i employs a thin film fuse 70. Assembly 50i may or may not use a glass-to-metal seal. As seen in FIG. 3, the process begins with a conductor 20, which is to be fused. Stem 32 and head 34 of conductor 20 include each of the alternative functions and features described above in connection with FIG. 3.

In FIG. 23, a central portion (32b not seen) of conductor 20 is removed, leaving outer portions 32a and 32c of the conductor. Next, notches 80a and 80b are machined in the inner ends of portions 32a and 32c. Slots 80a and 80b in an embodiment are 0.04 inch (1 mm) wide by 0.04 inch (1 mm) deep.

Figures 24A, 24B:
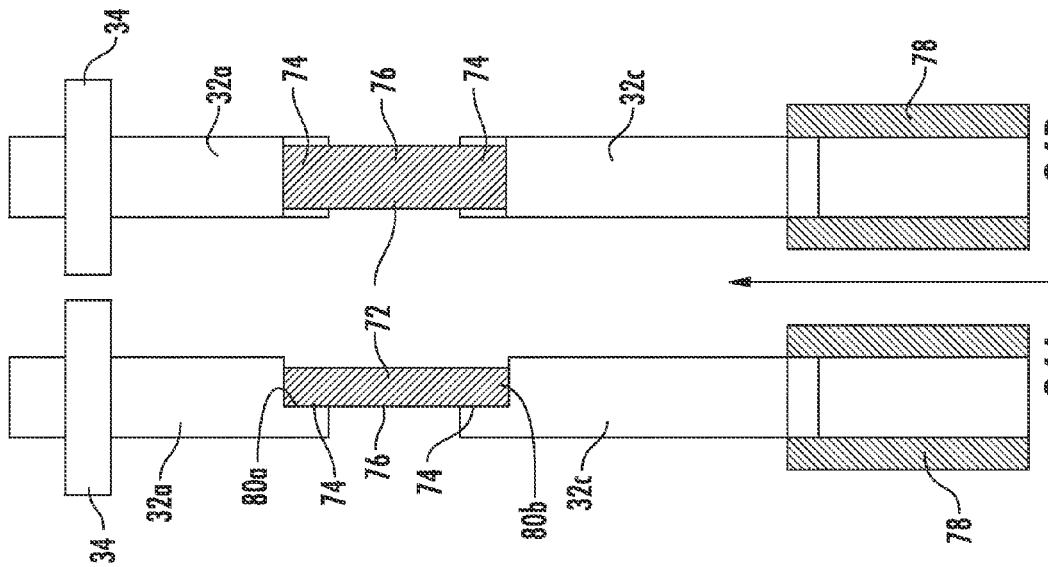

As seen in two different views in FIGS. 24A and 24B, a fuse 70 is soldered to notches 80a and 80b. Fuse 70 in one embodiment is the same fuse 70 described above, provided by the assignee of this application, which can be similar to its 0603 chip fuse. Fuse 70 can have a single substrate layer 72, which is plated on one side, e.g., via copper plating 74. Plating 74 is thinned to form a fuse element 76, which is configured to open upon an overcurrent condition.

Substrate 72 of fuse element 70 in one embodiment is made of a suitably electrically non-conducting material, such as an FR-4 material, ceramic, glass, polyimide or polyester. Substrate 72 can be at least substantially rectangular and be made relatively simply as described above.

Fuse 70 in one embodiment is soldered or otherwise bonded metallurgically to portions 32a and 32c of conductor 20. For example, solder paste can be applied to conductive platings or pads 74. Fuse 70 and portions 32a and 32c are then passed through a reflow oven as described above to cause an intermetallic bond to occur between pads 74 and portions 32a and 32c.

Next, fuse 70 is encapsulated. In one embodiment, fuse 70 is encapsulated with an epoxy coating 78 as described above for assembly 50h. In another, it is encapsulated with a nylon cap 78 as described above for assembly 50h. In a further alternative embodiment, cap 78 is made of a glass, which is suitable for being sealed chemically to the inner ends of portions 32a and 32c, which can be copper or oxygen-free copper, as described above for assembly 50h. Again, the application of assembly 50i can determine whether cap 78 is epoxy, nylon or glass.

Figure 26:
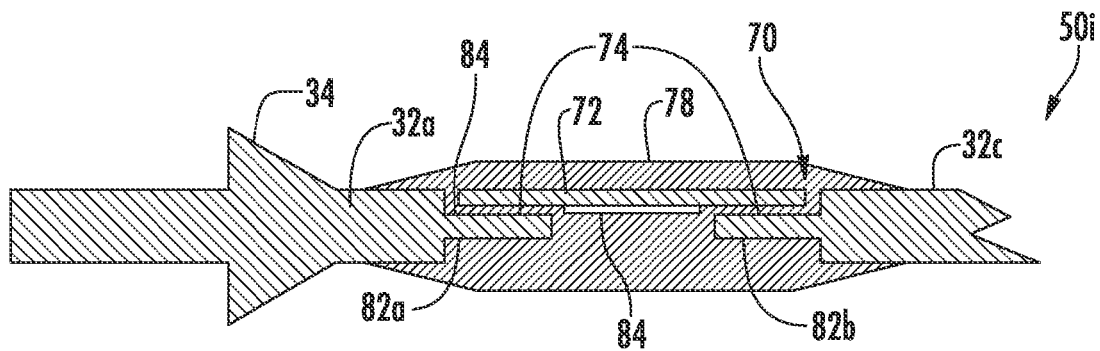
FIGS. 26 and 27 are side elevation and top plan views, respectively, illustrating an embodiment of a fused conductor including a thin film fuse bonded metallurgically to flat conductor portions.
Figure 27:
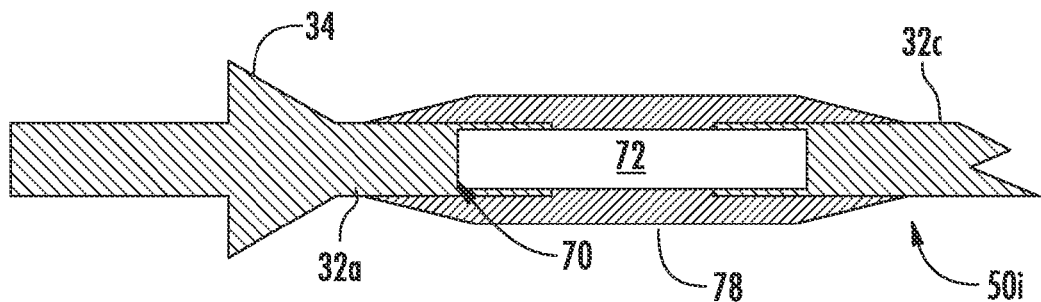

Referring now to FIGS. 26 and 27, front and top views, respectively, of another implementation of a notched or flattened fuse assembly 50i, employing solderable flats is illustrated. Here, flats 82a and 82b are machined into the inner ends of portions 32a and 32c of conductor 20. Flats 82a and 82b may be advantageous over the single-sided notches 80a and 80b of FIGS. 23 to 25 because they provide two solderable surfaces that may heat more evenly than the notched portions 32a and 32c of FIGS. 23 to 25, which may be rounded along their outer surfaces.

Fuse 70 is soldered or otherwise bonded metallurgically to portions 32a and 32c of conductor 20, e.g., via solder paste applied to conductive pads 74. Fuse 70 is encapsulated. In one embodiment, fuse 70 is encapsulated with an epoxy coating 78 as described above for assembly 50h. In another, it is encapsulated with a nylon cap 78 as described above for assembly 50h. In a further alternative embodiment, cap 78 is made of a glass, which is suitable for being sealed chemically to the inner ends of portions 32a and 32c, which can be copper or oxygen-free copper, as described above for assembly 50h. Or, flats 80a and 80b can be a dual metal or dumet material, which bonds chemically with a larger variety of glass caps.

Figure 28:
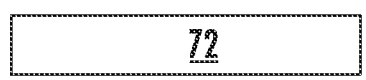
FIGS. 28 to 31 are top plan views illustrating one embodiment for making a thin film fuse used in different fused conductor embodiments described herein.
Figure 29:

One embodiment for making fuse 70 shown in FIGS. 28 to 31. Fuse 70 begins with a substrate 72, as seen in FIG. 28, which is FR-4, ceramic, glass, polyimide or polyester depending upon the application and type of cap 78 employed as has been described herein. As illustrated, substrate 72 can be a simple, single layer, rectangular substrate that does not require through holes or vias, e.g., for through hole plating. In FIG. 29, conductive, e.g., copper termination pads 74 and element area 76 are applied to substrate 72, e.g., via photo-etching or any other suitable technique. In one preferred embodiment, an array of many fuses is made using a single sheet of substrate material and separated into individual fuses 70. The substrate comes pre-plated and the non-plated areas between pads 74 and element area 76 are etched away.

Figure 30:
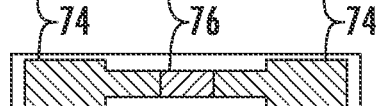

As seen in FIG. 30, element 76 includes a diffusion material (shown as different shading), which is a metal, e.g., tin or silver having a lower melting temperature than the underlying copper. The diffusion material helps contribute to the "M" or Metcalf effect mentioned above, which facilitates melting of the fuse portion 32b as the tin diffuses into the base metal during an overload condition, thereby increasing its electrical resistance and accelerating self-heating, while reducing its melting temperature. Diffusion material helps to create a fuse 70 with desirable opening characteristics.

Figure 31:
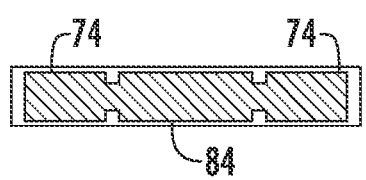

As seen in FIG. 31, element 76 is then protected via a cover 84. Cover 84 can be any suitable material, such as an epoxy.

Figure 32:
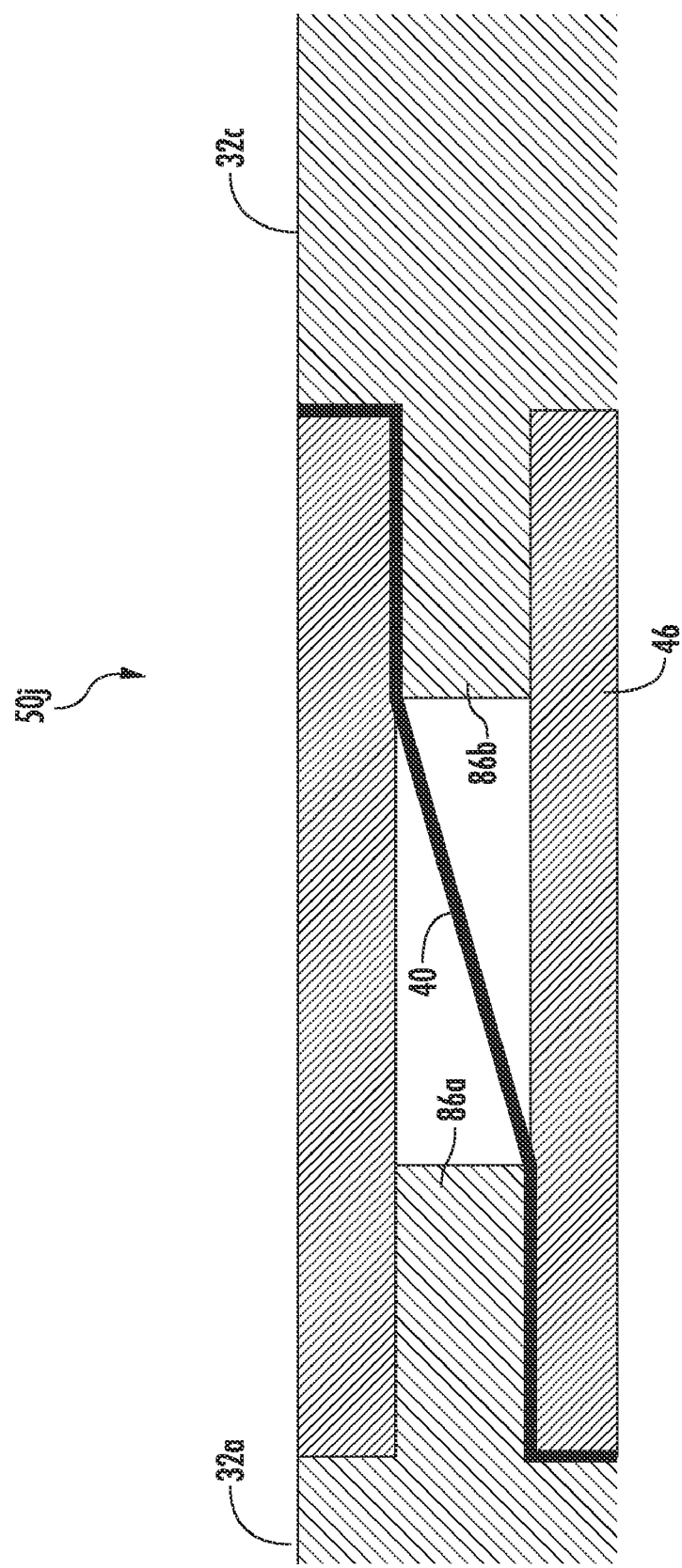
FIG. 32 is a side elevation view illustrating one embodiment of a fused conductor, which includes a wire fuse and a glass-to-metal seal.

Referring now to FIG. 32, a further alternative glass or ceramic tube-type fuse assembly is illustrated by assembly 50*j*. Fuse assembly 50*j* includes end portions 32*a* and 32*c* of conductor 20 as described above, which are separated by a gap created via the missing portion 32*b* of the conductor. Inner cylindrical ends 86*a* and 86*b* of portions 32*a* and 32*c* are machined to have a smaller diameter than that of the rest of portions 32*a* and 32*c*. In an alternative embodiment, cylindrical ends 86*a* and 86*b* are dumet wires that are soldered or otherwise connected electrically to portions 32*a* and 32*c*.

Assembly 50*j* includes a wire fuse element 40, which can be any of the alternative embodiments for wire element 40 described above in connection with FIGS. 9, 12 and 15. A glass body 46 (described above in connection with FIGS. 18 and 19) is fitted over cylindrical ends 86*a* and 86*b* and heated as described above in connection with fuse assembly 50*g*. Heating causes glass housing 46 to shrink or collapse and apply a compressive force to wire 40 and ends 86*a* and 86*b*, holding same together. Body 46 is alternatively ceramic.

One method for attaching wire 40 to assembly 50*j* is to serpentine a wire stock through a plurality bodies 46 and then turn bodies 46 so that they are aligned. Then, ends 86*a* and 86*b* of portions 32*a* and 32*c* are inserted into each end of body 46. Excess wire stock is then burned off, leaving wires 40.

In the illustrated embodiment, the outer diameter of body 46 is at least substantially flush with the outer diameters of portions 32*a* and 32*c*. Such configuration is desirable in certain applications in which the assembly needs to maintain a uniform diameter or a maximum diameter defined by portions 32*a* and 32*c*.

In an alternative embodiment, body 46 fits over non-narrowed ends of portions 32*a* and 32*c*, leaving a raised profile via body 46. Here, especially if portions 32*a* and 32*c* of conductor 20 are not of a dumet material, care must be taken to ensure that the type of glass of body 46 will bond chemically with the type of metal of portions 32*a* and 32*c*.

Whether or not narrowed ends 86*a* and 86*b* are used, it is contemplated to braze wire element 40 to ends 86*a* and 86*b* or to portions 32*a* and 32 of collector 20, while simultaneously heating and collapsing glass or ceramic body 46.

Figure 33:
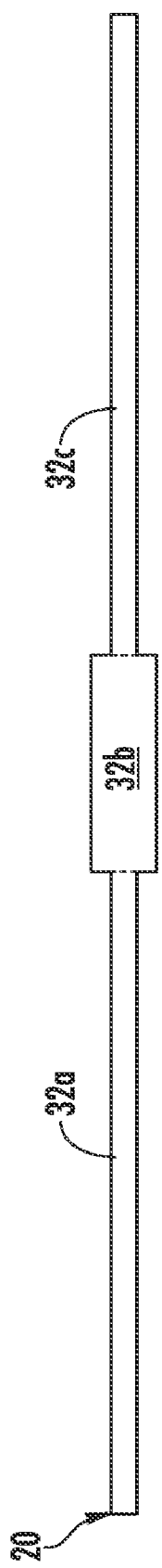

Referring now to FIGS. 33 to 36, a further alternative embodiment and method of making an integrally fused conductor is illustrated by fuse assembly 50*k*. Fuse assembly 50*k* begins as seen in FIG. 33 with a conductor 20, which can be a metallic wire, ribbon or in an embodiment an insulated, e.g., tin-plated copper, wire about 1.5 inches (38.1 mm) long by about 0.025 inch (0.64 mm) in diameter. A flat is made in middle section 32*b*, leaving ends 32*a* and 32*c*. In one implementation, flat 32*b* is about 0.22 inch (5.5 mm) long by about 0.067 inch (1.7 mm) wide. Ends 32*a* and 32*c* can therefore each be about 0.64 inch (16.3 mm) long. The dimensions listed are for illustration purposes only and are not intended to limit the scope of the invention in any way.

As seen in FIG. 34, a fuse element 90 is stamped out of flat 32*b*. In one implementation, conductor 20 is pulled through a progressive dye, which first creates flat 32*b* and then stamps element 90. Fuse element 90 as illustrated can have a serpentine shape in one embodiment. For example, element 90 could be stamped such that a distance of about 0.025 inch (0.64 mm) exists longitudinally between peaks of the serpentine shape and a distance of about 0.013 inch (0.32 mm) exists vertically from upper peak to lower peak.

As seen best in FIG. 35, the inner ends of conductors 32*a* and 32*c* are each stamped so that the outer ends of element 90 have or communicate with angled tabs 92*a* and 92*b*, respectively. FIG. 35 shows tab 92*a* in detail, which is the same as tab 92*b* in one embodiment. Tab 92*a* has widths Y1 and Y2 that are larger than diameter D of portion 32*a* (and 32*b*). Tab 92*a* extends at an angle α until reaching width Y2, after which tab 92*a* extends at a lesser angle β until reaching width Y1.

As seen in FIG. 34, angles α and β of both tabs 92*a* and 92*b* face the same direction. This is done so that housing 94 can only fit over tabs 92*a* and 92*b* when slid in the direction of the arrow shown in FIG. 34. Housing 94 can be made of any suitable glass, ceramic or polymer.

Figure 36:
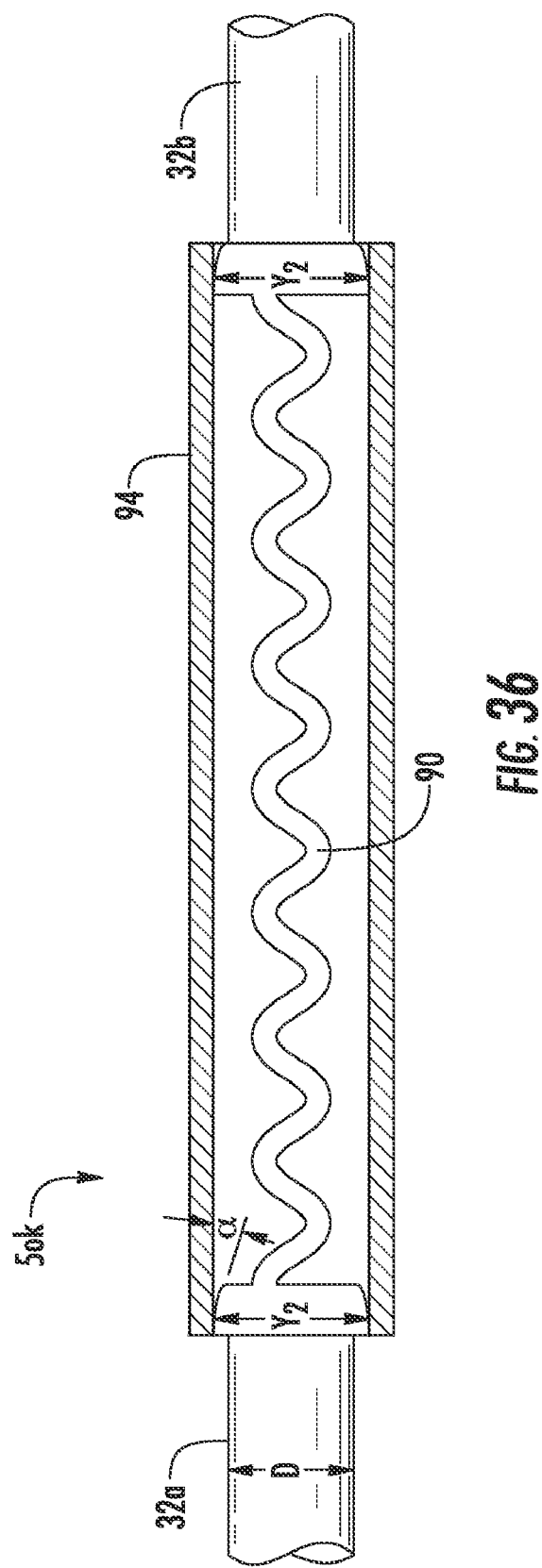

As seen in FIG. 36, when housing 94 is slid over element 90 and tabs 92*a* and 92*b*, the inner diameter of housing 94 compresses the β angle portion of tabs 92*a* and 92*b* to create a press-fit between housing 94 and tabs 92*a* and 92*b*. As seen, width Y2 is at least substantially the same as the inner diameter of housing 94. While housing 94 and tabs 92*a* and 92*b* are circular in cross-section in one preferred embodiment, they can alternatively be square, rectangular, etc.

As seen in FIG. 37, the press-fit interface between housing 94 and tabs 92*a* and 92*b* can optionally be further secured via adhesive 96, such as Hysol™ adhesive from Henkel-Loctite. Further, as seen in FIG. 38, assembly 50*k* can be completed by applying an encapsulating coating 98 around housing 94 (and adhesive 96). Encapsulating coating 98 can be a conformal coating, such as an epoxy coating, polymer coating, etc.

Referring now to FIGS. 39 to 42, one embodiment of a stamped fuse element 100 having a fusing alloy portion and method of making same is illustrated. Fuse element 100 can begin with the same structure as seen in FIG. 33, which can be a metallic wire, ribbon or tin-plated copper wire as described above. A flat is made again in middle section 32*b*, leaving ends 32*a* and 32*c*. In one implementation, flat 32*b* and ends 32*a* and 32*c* have dimensions described above in connection with FIG. 33.

In FIG. 39, a hole 102 is punched, drilled, laser cut or otherwise formed in flat 32*b*. The size of hole 102 depends on the size of the device being protected and a desired fuse amperage rating. In FIG. 40, an amount of a desired fusing alloy 104 is placed in hole 102. Fusing alloy 104 can be any suitable lower melting temperature fusing metal, such as tin or silver and may be provided in any suitable form, such as a pellet, paste, preform, etc. Fusing alloy 104 can be applied via screen printing, stencil printing, ink-jetting, pick and place application, any combination thereof, or via any other suitable method.

As seen in FIG. 40, the application of fusing alloy 104, shown figuratively as a square, is not yet bonded metallurgically with the metal of flat 32*b*. The fusing alloy application at this stage may not fill hole 102 completely. As seen in FIG. 41, in the next step, heat is applied to fusing alloy 104 in the form of soldering or brazing alloy 104. For example, fusing alloy 104 can be passed through a reflow oven, such that a paste form of fusing alloy 104 melts, flows throughout hole 102 and forms an intermetallic bond with the edge of hole 102. Brazing the fusing alloy 104 also causes it to flow throughout hole 102 and form an intermetallic bond with the edge of hole 102.

In FIG. 42, element 100 is stamped out of flat 32*b* as described above in connection with FIG. 34. Element 100 has the shape and dimensions set forth for serpentine element 90 in one embodiment. Element 100 has portions 106 that are the same metal as portions 32*a* and 32*c*. In FIG. 42, element 100 also has a fusing alloy portion 104 that communicates electrically with portions 106. The, e.g., tin, portion 104 of dual metal element 100 helps contribute to the "M" or Metcalf effect mentioned above, which facilitates melting of the fuse portion 32b as the tin diffuses into the base metal during an overload condition, thereby increasing its electrical resistance and accelerating self-heating, while reducing its melting temperature In the illustrated embodiment, tabs 92a and 92b described above in connection with FIGS. 34 to 36 are also stamped in combination with element 100. A fuse assembly similar to assembly 50k shown in FIGS. 36 to 38 is provided by sliding a housing over element 100 as described above. Adhesive (FIG. 37) and an encapsulant (FIG. 38) are also expressly contemplated for use with element 100.

Referring now to FIG. 43, yet another alternative fuse assembly 501 is illustrated in cross-section. Fuse assembly 501 is similar to fuse assembly 50e described above. Element 40 of fuse assembly 501 is crimped between ends of sections 32a and 32c of conductor 20. Annular grooves 52 and 54 are made near the ends of sections 32a and 32c. Head 34 of conductor 20 is shown as having a triangular cross section.

Element 40 in the illustrated embodiment is a wire made of one or more conductive material or metal. In an embodiment, element 40 is soldered to the ends of sections 32a and 32c via solder joints 148. A shrink-wrap enclosure 136 is placed around fuse element 40 to keep sections 32a and 32c separate and provide a rigid coupling.

As illustrated, the ends of shrink wrap enclosure 136 shrink or collapse into annular grooves 52 and 54 of sections 32 and 32c, respectively. Also, intersections 138 of shrink wrap enclosure 136 shrink or collapse into the space between sections 32a and 32c. The combination of the collapsing of the ends into grooves 52 and 54 and the collapsing of the middle 138 of heat-shrink enclosure 136 causes a rigid connection to be made between the heat shrunk enclosure 136 and conductive sections 32a and 32c.

In an embodiment, enclosure 136 is able prior to being heated to slide over conductor section 32c and in position over element 40. This is done as sections 32a and 32c are held a predetermined distance from one another. Next, tube 136 is shrunk, creating the rigid press fit enclosure, which fits tightly around the ends and annular grooves 52 and 54 of conductive sections 32a and 32c, respectively.

Figure 44:
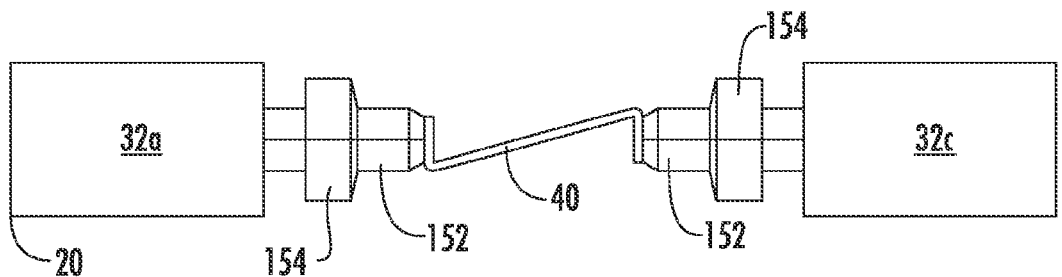
FIGS. 44 to 46 illustrate yet a further alternative embodiment of a fused conductor including a wire fuse element, heat shrink sleeve and molded plastic enclosure.
Figure 45:
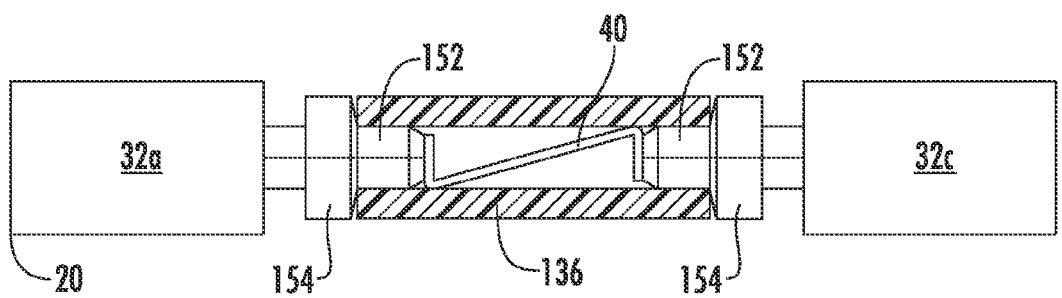
Figure 46:
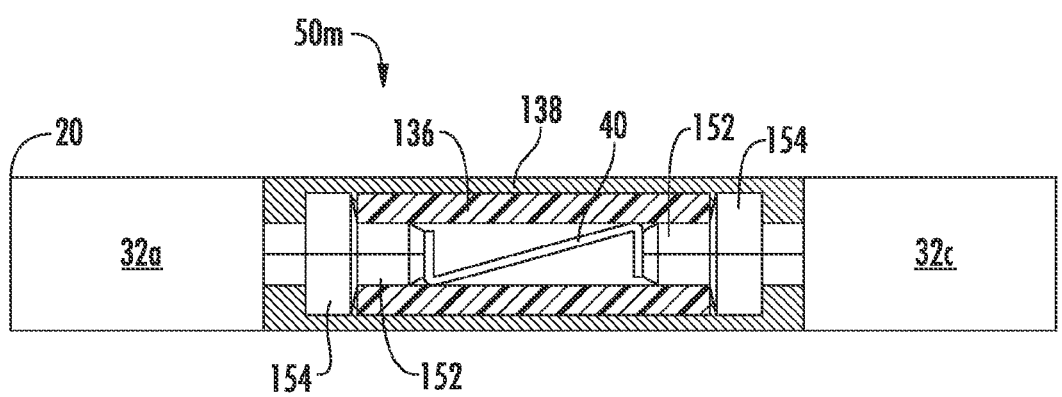

Referring now to FIGS. 44 to 46, a yet further alternative fuse assembly 50m in various stages of production is illustrated. In FIGS. 45 and 46, heat-shrink sleeve 136 and molded housing 138 are shown in cross-section, while conductor portions 32a and 32c and fuse element 40 are shown not sectioned for purposes of illustration.

The inner ends of conductive sections 32a and 32c are machined to have thinned projections 152 and larger radius flanges 154 extending outwardly from thinned projections 152. Thinned projections 152 help to locate element 40 in the proper position and also allow for heat-shrink enclosure 136 and molded housing 138 to be applied such that the outer diameter of housing 138 is less than or at least substantially flush with the outer diameter of the main part of conductor sections 32a and 32c. Flanges 154 serve to hold heat-shrink tube 136 in place as seen for example in FIGS. 45 and 46.

As discussed, thinned projections 152 and flanges 154 are machined out of conductor sections 32a and 32c in one embodiment. Alternatively, thinned projections 152 and flanges 154 are made separately and then soldered, mechanically engaged (e.g., threaded), or chemically bonded to the ends of conductor sections 32a and 32c.

Before being heat-shrunk about thinned projections 152, heat-shrink sleeve 136 is slid over one of conductor sections 32a or 32c and in place between flanges 154. After heat-shrink sleeve 136 is located in the proper position, it is heated so that it shrinks around thinned projections 152. Heat-shrink sleeve 136 ensures that an air gap resides around element 40. An air gap can be important because it can allow element 40 to open properly. Air is a good thermal insulator and can help concentrate the self-heating effect on element 40. Also, the air gap gives a place for the element to release energy when it opens.

It is not necessary however to have the air gap. Indeed, it is contemplated not to provide sleeve 136 and instead fill the air gap space with the material of molded housing 138. This provides for good mechanical rigidity and is simpler to make without sleeve. Element 40 should be of a suitably small diameter to compensate from thermal loss due to direct contact with the material of molded housing 138.

Molded housing 138 can be any suitable insulative moldable material, such as a semi-rigid or rigid plastic. Suitable plastics include polycarbonate, Ryton, Valox, nylon and others. Alternatively to being molded, housing 138 can be cast or wrapped around sleeve 136 and flanges 154. Housing 138 adds rigidity and strength to the overall fuse assembly 50m of the fused conductor 20. Here, fuse assembly 50m does not rely on the heat-shrink material 136 to provide the necessary rigidity.

In an embodiment, fuse element 40 is soldered to the tips of thinned projections 152. In an alternative embodiment, element 40 is secured to thinned sections 152 via heat-shrink sleeve 136.

As seen, heat-shrink sleeve 136 and flanges 154 are both sized and configured such that heat-shrink sleeve 136 after heated has an outside diameter at least substantially flush with the outer diameter of flange 154. As also seen, the outer diameter of flange 154 is slightly less than the outer diameter of the remainder of conductor sections 32a and 32c. Also, a small portion of thinned section 152 extends from flange 154 to the main body of conductor sections 32a and 32c. This configuration allows rigidity and strength providing housing 138 to interlock around flange 154 and thereby be fastened securely to conductor sections 32a and 32c. The configuration also allows the outer diameter of housing 138 to be at least substantially flush with the outer diameter of the remainder of sections 32a and 32c as illustrated.

Figure 47:
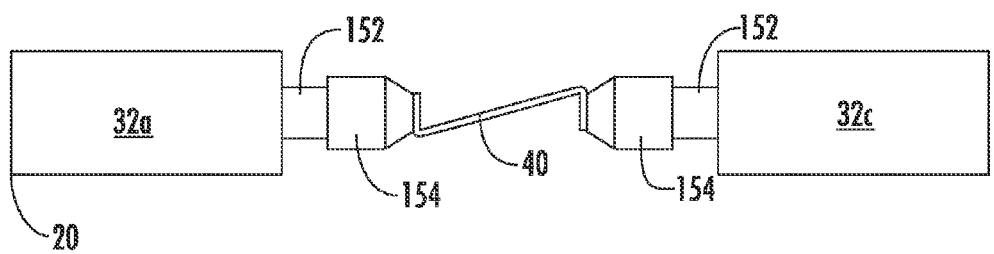
FIGS. 47 to 49 illustrate still a further alternative embodiment of a fused conductor having a wire fuse element, protective plastic sleeve and molded enclosure.
Figure 48:
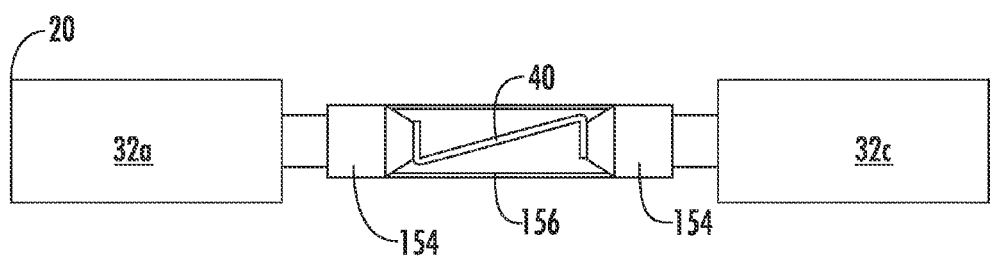
Figure 49:
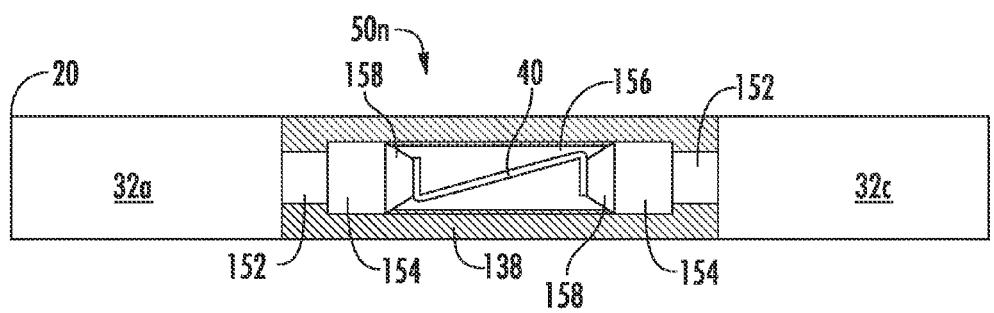

Referring now to FIGS. 47 to 49, a yet further alternative fuse assembly is illustrated by fuse assembly 50n in various stages of manufacture. Fuse assembly 50n is placed between conductive sections 32a and 32c as described above. The ends of sections 32a and 32c include thinned projections 152 and larger radius flanges 154 as described above with fuse assembly 50m. The shape of projections 152 and flanges 154 is different here than those of fuse assembly 50n. Different configurations are possible.

Fuse element 40 in the illustrated embodiment is a wire or thinned metal element, which is soldered to the ends of sections 32a and 32c or is otherwise secured to the conductive sections via alternative sleeve 156.

The primary difference between fuse assembly 50n and fuse assembly 50m is the use of an alternative sleeve 156 as shown in FIGS. 48 and 49. Sleeve 156 is a thin, e.g., plastic sleeve, which again serves to maintain an air gap around fuse element 40. The material of sleeve can be any suitable plastic material described herein. In an embodiment, sleeve 156 is wrapped around conical heads 158 that taper down from flanges 154. Sleeve 156 is then adhered to itself and/or heads 158 or flanges 154 to secure sleeve 156 in place. Thin plastic sleeve 156 can be a less expensive alternative to heat-shrink sleeve 136 in FIGS. 45 and 46 of fuse assembly 50m.

A housing, such as a plastic housing 138 is molded or cast around the outside of sleeve 156, flanges 154 and thinned sections 152, so that it is fixed securely or interlocked to the inner ends of conductive sections 32a and 32c, and at the same time maintains a diameter smaller or at least substantially flush with the outer diameters of the main portions of conductor section 32a and 32c. Suitable materials for housing 138 include any of those listed above for housing 138 of fuse assembly 50m. Housing 138 as before adds strength and rigidity to the overall fuse assembly 50n placed within conductor 20 having conductor sections 32a and 32c. Again, it is not necessary to have the air gap, and it is contemplated not to provide sleeve 156 and instead fill the air gap space with the material of molded housing 138.

Figure 50:
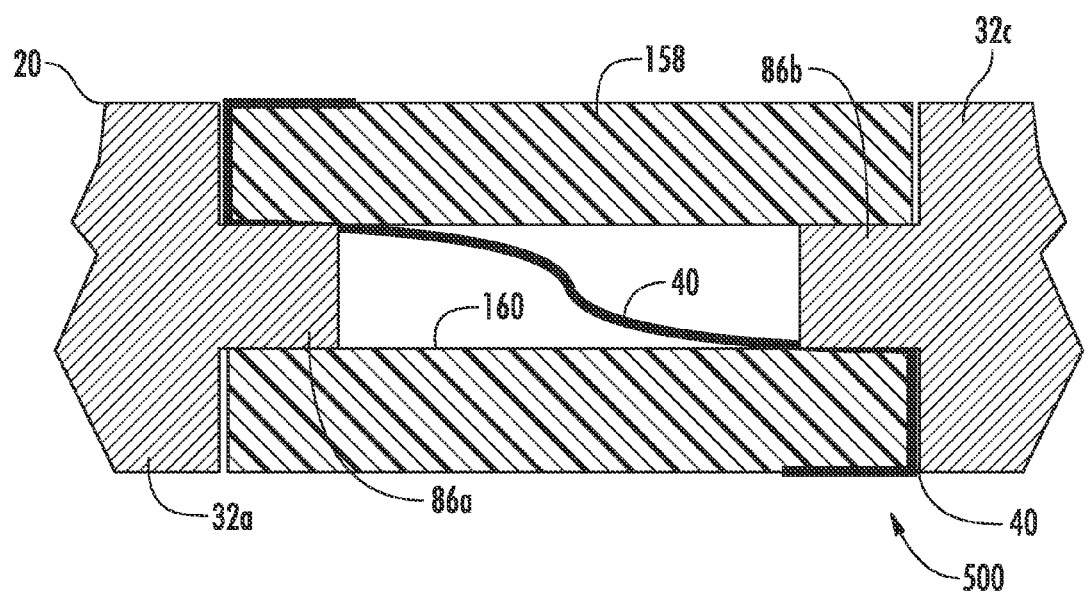
FIG. 50 is a sectioned view of still another alternative embodiment for a fused conductor having a press-fit polymer enclosure.

Referring now to FIG. 50, a still further alternative fuse assembly is illustrated by fuse assembly 50o. Fuse assembly 50o is similar to that of fuse assembly 50j of FIG. 32. Fuse assembly 50j as discussed above includes a glass or ceramic body 46. Fuse assembly 50o on the hand includes a plastic, e.g., molded or cast, housing 158.

Fuse assembly 50o includes end portions 32a and 32c of conductor 20 as described above, which are separated by a gap created by missing portion 32b of the conductor. Inner cylindrical ends 86a and 86b of portions 32a and 32c, respectively, are machined or otherwise formed to have a smaller diameter of than that of the rest of portions 32a and 32c. In an alternative embodiment, cylindrical ends 86a and 86b are separate wires that are soldered or otherwise connected electrically to portions 32a and 32c. Cylindrical ends 86a and 86b are sized to create a press-fit within the cylindrical opening formed by the inner wall 160 of plastic housing 158. Plastic housing 158 can be any suitable semi-ridged or ridged insulative polymeric material, such as polycarbonate, Ryton, nylon or any suitable materials listed herein.

Element 40 in an embodiment is a wire or thinned metal element as described herein, and is cramped between inner cylindrical ends 86a and 86b and the cylindrical opening formed by inner wall 160 of housing 158. In an embodiment, the interference fit is enough to hold ends 86a and 86b of conductor portions 32a and 32c tight within housing 158. In an alternative embodiment, an adhesive is used in addition to the interference fit. In a further alternative embodiment, fuse element 40 is additionally soldered to, e.g., ends 86a and 86b of portions 32a and 32c.

Although not illustrated, it is contemplated to form fuse element 40 on the outer wall of housing 158. For example, when conductor 20 is to be placed in a sealed environment or otherwise in an environment in which it is safe for element 40 to be exposed, element 40 can be impregnated into the polymeric housing 158. Alternatively, element 40 is a conductive ink, which is applied across the outside of housing 158. In yet another alternative embodiment, element 40 is a thin metal foil that is rolled over or otherwise applied to the outside of housing 158 and placed in electrical communication with portions 32a and 32c of conductor 20. The thin metal foil can include a single metal, an alloy or multiple metals as desired to create the proper opening of assembly 50o.

Referring now to FIG. 51, still another alternative fuse assembly is illustrated by assembly 50p. Assembly 50p includes end portions 32a and 32c of conductor 20 as described above, which are separated by a gap created via the missing portion 32b of conductor 20.

Assembly 50p includes a wire or thinned metal fuse element 40, which can be any of the alternative embodiments for wire element 40 described above in connection with FIGS. 9, 12 and 15, for example. Fuse element 40 in an embodiment is soldered to end portions 32a and 32c of conductor 20. Alternatively, fuse element 40 is attached mechanically to end portions 32a and 32c of conductor 20.

A second element 162 is an insulated shaped memory alloy element. Suitable materials for shape memory alloy element are described in co-pending patent application Ser. No. 11,144,238, entitled, Overtemperature Protection Devices, Applications And Circuits, filed Jun. 2, 2005, assigned to the assignee of the present application, the entire contents of which are hereby incorporated by reference and relied upon. Generally, upon being overheated the shape memory alloy metal returns to a preformed shape.

In this case, shape memory alloy element 162 returns to a flat or nonbent shape upon being overheated. Further in this case, shape memory alloy element 162 is insulated, for example via an insulating plastic. The plastic outer coating of shape memory alloy element 162 is fastened at each end either mechanically or chemically to conductors 32a and 32c. Alternatively, the alloy element 162 extends through its insulating coating at the ends and is soldered to conductors 32a and 32c Although not illustrated, a housing, such as an insulative housing is fastened to end portions 32a and 32c to hold the portions in a fixed relationship to one another. The housing or enclosure can be plastic, glass, ceramic or any suitable material described herein.

Upon being heated to an activation temperature, shape memory alloy element 162 returns to its preformed or flattened shape and pulls one end of fuse element 40 from either end portion 32a or 32c of conductor 20 to open the electrical connection. Until that happens, current is able to pass through the current carrying element 40.

Referring now to FIG. 52, still a further alternative fuse assembly is illustrated by assembly 50q. Assembly 50q includes end portions 32a and 32c of conductor 20 as described above, which are separated by a gap created via the missing portion 32b of conductor 20.

Assembly 50q includes a wire or thinned metal fuse element 40, which can be any of the alternative embodiments for element 40 described above for example in connection with FIGS. 9, 12 and 15. Element 40 is fixed, e.g., soldered, to end portion 32a of conductor 20. Element 40 is in sliding contact with end portion 32c of conductor 20.

An alternative shape memory alloy member 164, which can be any of the material referenced above, is fixed at one end to conductor 32a. For example, alloy element 164 can be soldered to end portion 32a. The other end of shape memory alloy element 164 is connected, e.g., soldered to fuse element 40. Shape memory alloy element 164 does not have to have an insulative coating as described above with shape memory alloy element 162 of FIG. 51.

An insulative collar 166 is fitted around the inner end of conductive portion 32c. The end of conductor 32c can be machined to accept the collar 166. Insulative plastic posts 168 are fixed, e.g., mechanically or chemically to conductor portions 32a and 32c to hold the portions in a fixed relationship apart from each other.

Upon an over-temperature condition, shape memory alloy element 164 shrinks or shortens and thereby pulls fuse element 40 away from conductive portion 32c, such that the end 170 of fuse element 40 retracts and rests instead against insulative collar 166. In this manner, the electrical connection opens upon shape memory alloy element 164 reaching its activation temperature. As with assembly 50p of FIG. 51, assembly 52q can include an insulative housing not illustrated here.

Referring now to FIG. 53, yet another alternative fuse assembly is illustrated by assembly 50r. Assembly 50r includes end portions 32a and 32c of conductor 20 as described above, which are separated by a gap created via the missing portion 32*b* of conductor 20. The inner ends of conductor portions 32*a* and 32*c* include the thinned inner projections 152, and radially extending flanges 154 and tapered heads 158 described above in connection with assembly 50*n* of FIGS. 47 to 49. Fuse element 40 is attached to tapered heads 158 as described above for that assembly. Fuse element 40 includes any of the alternative embodiments for wire element 40 described above in connection with FIGS. 9, 12 and 15.

The primary difference and advantage of assembly 50*r* is the clamshell insulative, e.g., plastic housing 172. Housing 172 as illustrated has a clamshell type shape, which enables it to be placed around and fitted together, e.g., via an interference fit between blocking members 174 and 176 of clamshell housing 172. As seen in FIG. 54, clamshell housing 172 has first and second clamshell halves 178 and 180, which are hinged together at hinge 182. The inner profile of halves 178 and 180 is molded or otherwise caused to fit snuggly around thinned projections 152, flanges 154 and potentially a portion of each of conical sections 158. Also, the inner profile of halves 178 and 180 is structured to create a gap for fuse element 40 to open properly.

Suitable materials for clamshell housing 172 include polycarbonate, Ryton, nylon, or any other suitable rigid material listed herein. Although clamshell 172 is shown as snap-fitting or interference-fitting together halves 178 and 180, alternative modes of securing the halves together can be used, such as an adhesive securement, a melting or welding of the halves together, mechanical binding of the halves together and any combination thereof. Further, while clamshell 172 is shown having hinge 182, it is also contemplated to create two separate halves that are secured together via any of the methods just previously described.

Again, it is not necessary however to have the air gap. Indeed, it is contemplated not to fill the air gap space with the material of clamshell housing 172. Element 40 should be of a suitably small diameter to compensate from thermal loss due to direct contact with the material of clamshell housing 172.

Figure 55:
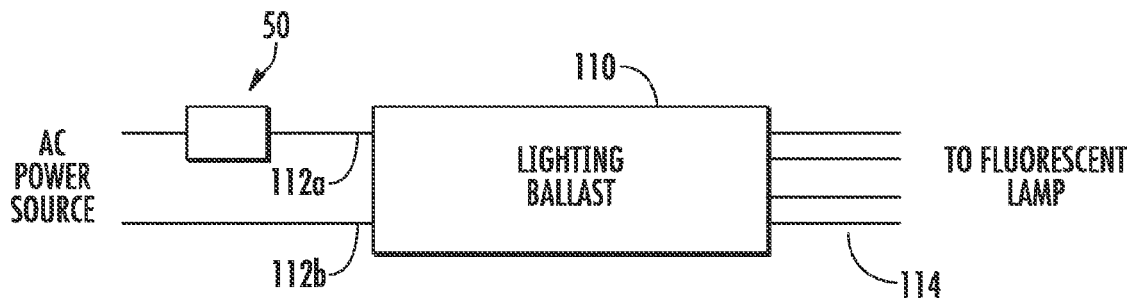
FIGS. 55 to 60 are various views of different example applications for the fused conductors described herein.

Referring now to FIG. 55, one application for any of the fuse assemblies 50 (referring collectively to assemblies 50*a* to 50*k*) is in a lighting ballast. Electronic lighting ballast 110 is powered by an alternating current power source via wires or leads 112*a* and 112*b*. Ballast 110 also includes leads 114 that connect to a fluorescent lamp for example. As seen, assembly 50 is integrated into lead or conductor 112*a* on the power input side of lighting ballast 110. Fuse assembly 50 protects electrical ballast 110.

Figure 56:
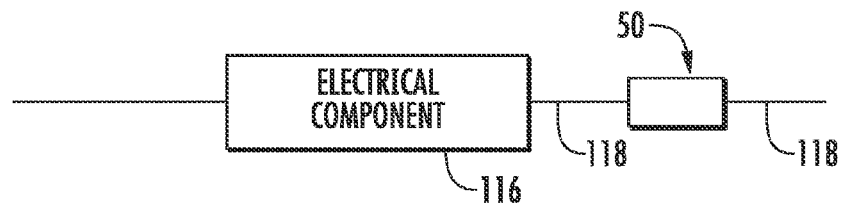

Referring now to FIG. 56, another application for assembly 50 is illustrated. Here, an electrical component 116 is provided. Electrical component 116 can be any suitable electrical component, such as a power resistor, diode, capacitor, inductor or conductor for example. A lead 118 extends from electrical component 116. Lead 118 is fused with fuse assembly 50. Fuse assembly 50 protects component 116 and other components connected operably to component 116.

Figure 57:
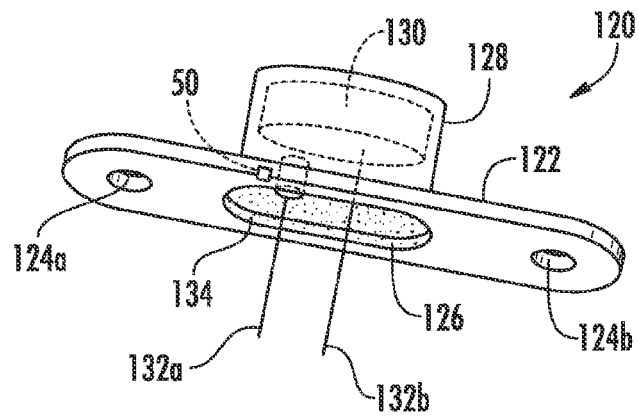

Referring now to FIG. 57, another application for fuse assembly 50 is a metal transistor canister 120. Metal transistor canister 120 includes a mounting plate 122, which can have an elliptical shape as shown. Mounting plate 122 includes or defines mounting holes 124*a* and 124*b*. Mounting plate 122 also defines a larger central aperature 126. A hat or can 128 is formed with or attached to base plate 122. A transistor or silicon based electrical component, such as a field effect transistor ("FET"), is mounted inside hat 128. Silicon based component 130 includes an emitter lead 132*a* and a base lead 132*b*. In the illustrated embodiment, emitter lead 132*a* is fused with fuse assembly 50.

In an embodiment, fuse assembly 50 is located inside hat 128 with silicon based electrical component 130. A potting material 134 is then filled into aperature 126 to protect silicon component 130, fuse assembly 50 and to isolate those components from the environment. If the silicon or FET device 130 fails, fuse assembly 50 prevents a catastrophic electrical failure from occurring inside potting 134. Fuse assembly 50 thereby protects components around metal transistor canister 120 if component 130 fails.

Figure 58:
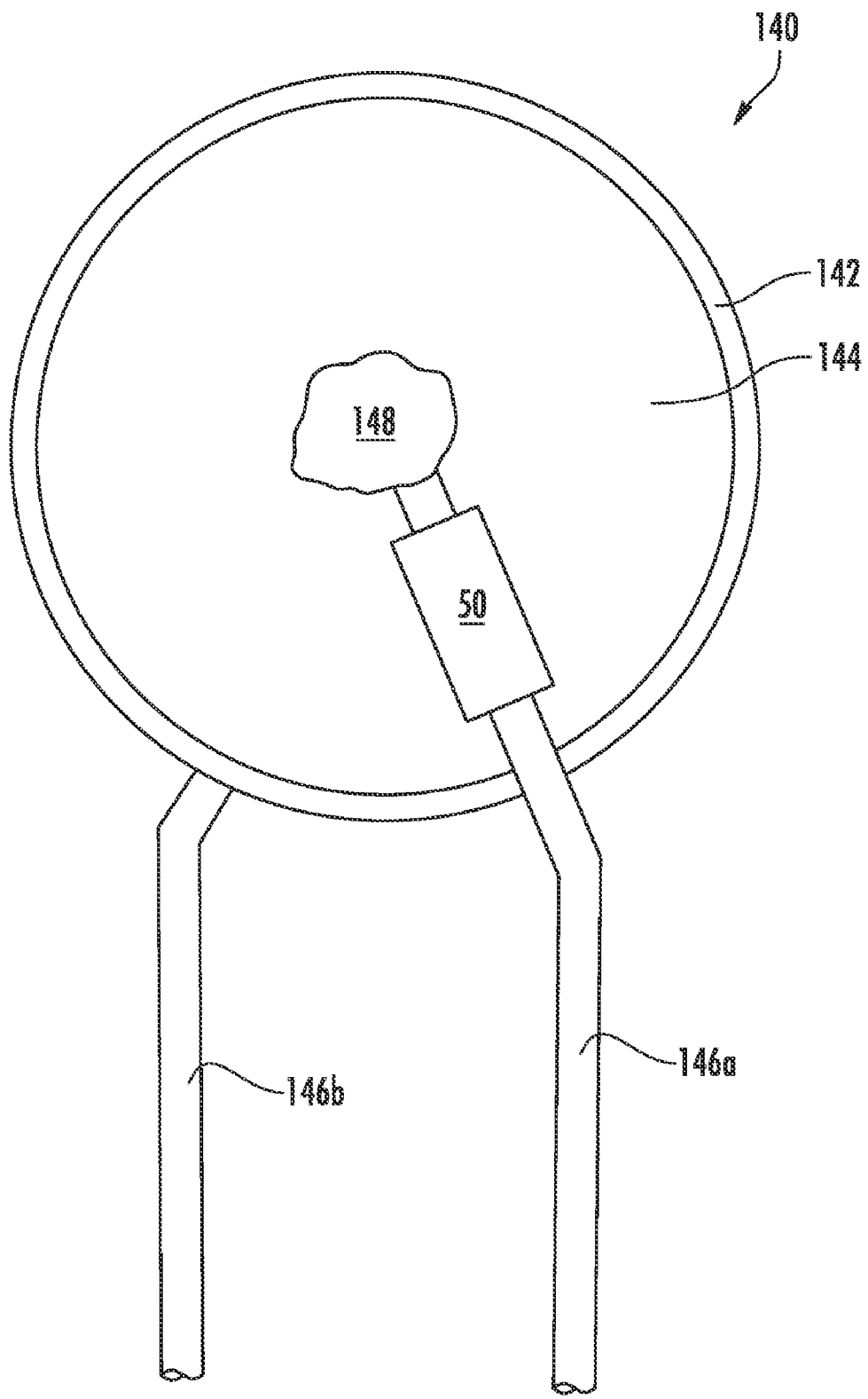

Referring now to FIG. 58, another application for fuse assembly 50 is with a varistor 140, for example, a varistor provided by the assignee of the present invention. Varistor 140 includes a disk of varistor material 142 known to those of skill in the art, such as a ceramic-based material. Metal electrodes, such as circular electrode 144, are applied to both sides of varistor disk 142. Leads 146*a* and 146*b* are each soldered, e.g., via a solder mass 148, to one of the metal electrodes 144, respectively. One of the leads 146*a* is fused with fuse assembly 50. A protective coating (not illustrated) is provided on the outside of varistor 140 and disk 142. The coating can also enclose fuse assembly 50.

In operation, varistor disk 142 operates in a known manner to provide overvoltage protection. If an electrical overstress occurs that is of a magnitude sufficient to damage or destroy varistor disk 142, fuse assembly 50 opens and prevents a cataclysmic failure as described above.

Figure 59:
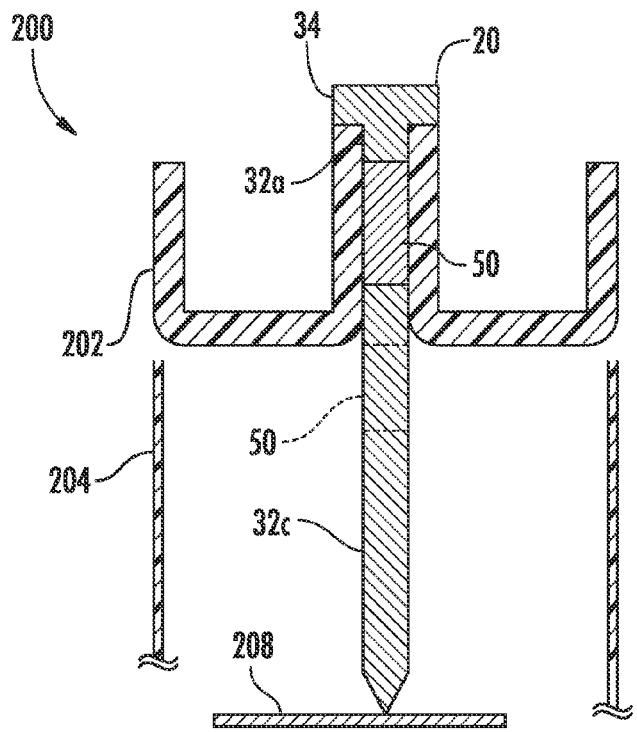

Referring now to FIG. 59, another application 200 for fuse assembly 50 (any of the above fuse assemblies 50*a* to 50*r*) is with any type of electrically insulating body 202, such as the body of a connector, strain relief member (e.g., on both ends of power adapter cords adjacent to the plug and transformer), power supply, etc. This application makes use of the sealing properties of the existing insulative housing 202. Housing 202 can be plastic, rubber, or any other suitably insulating and sealable material.

Fuse assembly 50 is placed between conductor portions 32*a* and 32*c* of conductor 20 as described above. As illustrated, fuse assembly 50 can be positioned such that it resides within body 202 or alternatively (in phantom) within the electrical component 204 (e.g., connector, power cord plug or power cord transformer) to which body 202 is mated.

Conductor portion 32*c* includes or defines a spiked or sharpened tip 206, which is capable of piercing through body 202 in such a manner that body 202 thereafter seals around conductor 20. In this case, fuse assembly 50 should be rigid enough to withstand the compressive force needed to push tip 206 and conductor 20 through the sealing thickness of insulative body 202. Here, conductor 20 and fuse assembly 50 can be inserted into insulative body 202 after body 202 and associated electrical component 204 are formed.

Conductor portion 32*c* contacts an electrode 208 within component 204 in the illustrated embodiment. Electrode 208 can be a surface mount electrode. Alternatively, conductor portion 32*c* is configured to contact a mating pin or electrode of a device that mates with component 204, e.g., when component 204 is a connector. For example, conductor portion 32*c* can extend through a printed circuit board and make electrical contact with an electrical trace on the board as well as with a component mated to component 204.

Figure 60:
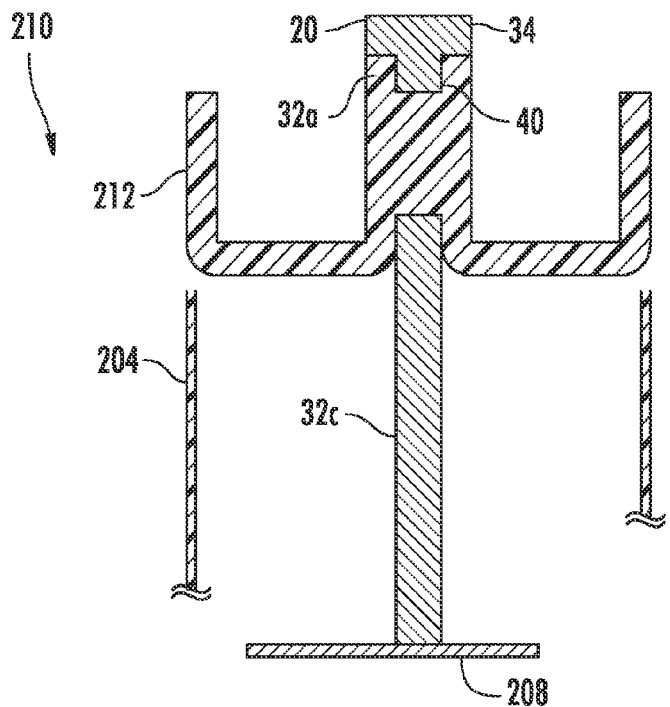

Referring now to FIG. 60, an application 210 for conductor 20 having the integral fuse element 40 is with any type of electrically insulating body 212, such as the body of a connector, strain relief member (e.g., on both ends of power adapter cords adjacent to the plug and transformer), power supply, etc. Here body 212 is formed with conductor 20 and fuse element 40. Fuse element 40 can be of any type described herein. Housing 212 can be plastic, rubber, or any other suitably insulating and sealable material.

Fuse element 40 is placed, e.g., soldered, between conductor portions 32a and 32c of conductor 20 as described above. In this case, sharpened tip 206 is not needed and fuse element 40 does not need to withstand a compressive force needed to push conductor 20 through the sealing thickness of insulative body 212. Here instead, insulative body 212 is formed, e.g., molded or cast around fuse element 40. Housing 212, conductor 20 (including portions 32a and 32c) and element 40 are fitted together in the same operation.

Here, element 40 is contacted by the material of housing 212 and should of a material and construction capable of withstanding such contact and the process of forming body 212. Housing 212 serves also as the housing for fuse element 40 and therefore eliminates the additional housing of fuse assembly 50. Although it may be desirable to maintain an air gap around fuse element 40 for proper opening of the element (see, e.g., FIGS. 44 to 49), this not necessary in all cases. It is easier to manufacture the device without an air gap. This configuration also adds mechanical rigidity. The element should be smaller in diameter to offset the self-heating loss due to direct contact with the insulative material.

Conductor portion 32c contacts an electrode 208 within component 204 in the illustrated embodiment. Electrode 208 can be a surface mount electrode. Alternatively, conductor portion 32c is configured to contact a mating pin or electrode of a device that mates with component 204, e.g., when component 204 is a connector. For example, conductor portion 32c can extend through a printed circuit board and make electrical contact with an electrical trace on the board as well as with a component mated to component 204.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. An integrally fused assembly comprising:
a housing;
a first conductor located within the housing and comprising a first electrical path;
a second conductor located within the housing and comprising a second electrical path separate from the first electrical path; and
a fuse conductor integrally formed within the first conductor, the fuse conductor having a stem portion and a head portion, the head portion disposed at an end of the stem portion and configured to secure the fuse within the housing, the stem portion including a thinned portion that is configured to open upon an overcurrent event and that is protected by an enclosure, the enclosure being disposed within the housing, and the thinned portion being disposed both within the housing and within the enclosure.

2. The integrally fused assembly of claim 1, which includes a film placed on a substrate.

3. The integrally assembly of claim 1, wherein the fuse conductor is at least substantially circular or rectangular in cross-section.

4. The integrally fused assembly of claim 1, which is produced via a process selected from the group consisting of: etching, grinding, coining, stamping, milling and any combination thereof.

5. The integrally fused assembly of claim 1, wherein the enclosure is made of at least one material selected from the group consisting of: glass, ceramic and plastic.

6. The integrally fused assembly of claim 1, wherein the enclosure is connected to separate sections of the fuse conductor via at least one process selected from the group consisting of: press-fitting, epoxy adhesion, radiant heating, induction heating and laser heating.

7. The integrally fused assembly of claim 1, wherein the thinned portion is bent toward a center of the stem portion.

8. An integrally fused assembly comprising:
a housing;
a first conductor located within the housing and comprising a first electrical path;
a second conductor located within the housing and comprising a second electrical path separate from the first electrical path;
wherein at least one of the first and second conductors includes an integral fuse conductor defined by a stem portion and a thinned portion configured to open upon an overcurrent event and a head portion disposed at an end of the stem portion and configured to secure the fuse within the housing; and
wherein the enclosure is disposed within the housing and the thinned portion is disposed within the housing and the enclosure.

9. The integrally fused assembly of claim 8 wherein the thinned portion includes a metallization formed on at least substantially all of an inner surface of an enclosure that joins separate sections of the fuse conductor.

* * * * *